US012684869B2

(12) United States Patent　　　　　(10) Patent No.: US 12,684,869 B2
　Kang et al.　　　　　　　　　　　　　(45) Date of Patent: Jul. 14, 2026

(54) CONTACT PLACEHOLDER FORMATION FOR DIFFERENT DEVICE TYPES

(71) Applicant: International Business Machines Corporation, Armonk, NY (US)

(72) Inventors: Tsung-Sheng Kang, Ballston Lake, NY (US); Tao Li, Slingerlands, NY (US); Ruilong Xie, Niskayuna, NY (US); Oleg Gluschenkov, Tannersville, NY (US)

(73) Assignee: International Business Machines Corporation, Armonk, NY (US)

( * ) Notice: Subject to any disclaimer, the term of this patent is extended or adjusted under 35 U.S.C. 154(b) by 369 days.

(21) Appl. No.: 18/490,134

(22) Filed: Oct. 19, 2023

(65) Prior Publication Data

US 2025/0133827 A1　　Apr. 24, 2025

(51) Int. Cl.
　　*H10D 86/60*　　　　(2025.01)
　　*H10D 86/01*　　　　(2026.01)
　　*H10D 86/40*　　　　(2025.01)
(52) U.S. Cl.
　　CPC ......... *H10D 86/60* (2025.01); *H10D 86/0214* (2025.01); *H10D 86/0221* (2025.01); *H10D 86/421* (2025.01); *H10D 86/441* (2025.01)
(58) Field of Classification Search
　　CPC ............... H10D 86/60; H10D 86/0214; H10D 86/0221; H10D 86/421; H10D 86/441; H10D 30/6735; H10D 30/6757; H10D 30/0198; H01L 21/76897; H01D 84/013; H01D 84/0149; H01D 84/8312; H01D 84/832
See application file for complete search history.

(56) References Cited

U.S. PATENT DOCUMENTS

| | | |
|---|---|---|
| 9,711,644 B2 | 7/2017 | Pawlak |
| 10,727,133 B2 | 7/2020 | Gao et al. |
| 10,892,338 B2 | 1/2021 | Zang et al. |
| 11,011,618 B2 | 5/2021 | Lai et al. |
| 11,581,224 B2 | 2/2023 | Su et al. |
| 2020/0219978 A1 | 7/2020 | Guler et al. |
| 2022/0093592 A1 | 3/2022 | Guler et al. |
| 2022/0139911 A1 | 5/2022 | Wei et al. |
| 2023/0048829 A1* | 2/2023 | Lee ..................... H10D 64/017 |
| 2023/0061857 A1 | 3/2023 | Lin et al. |

(Continued)

*Primary Examiner* — Steven B Gauthier
*Assistant Examiner* — Marc-Anthony Armand
(74) *Attorney, Agent, or Firm* — Samuel Waldbaum; Ryan, Mason & Lewis, LLP

(57)　　　　　ABSTRACT

A semiconductor structure comprises at least one first nanosheet transistor and at least one second nanosheet transistor disposed on a dielectric layer. The first nanosheet transistor comprises at least one first source/drain region disposed on a side of the first nanosheet transistor. The second nanosheet transistor comprises at least one second source/drain region disposed on a side of the second nanosheet transistor. The second source/drain region has a larger dimension along a given direction than a dimension of the first source/drain region along the given direction. One of a dielectric fill layer and an air gap is disposed in the dielectric layer and under the second source/drain region. A semiconductor layer is disposed under the second source/drain region, in the dielectric layer and around the one of the dielectric fill layer and the air gap.

19 Claims, 18 Drawing Sheets

(56) References Cited

U.S. PATENT DOCUMENTS

| 2023/0075343 | A1 | | 3/2023 | Yu et al. |
| 2023/0093101 | A1 | | 3/2023 | Xie et al. |
| 2023/0411481 | A1 | * | 12/2023 | Chang .................... H10D 84/83 |

* cited by examiner

High-performance device
X2

High-density device
X1

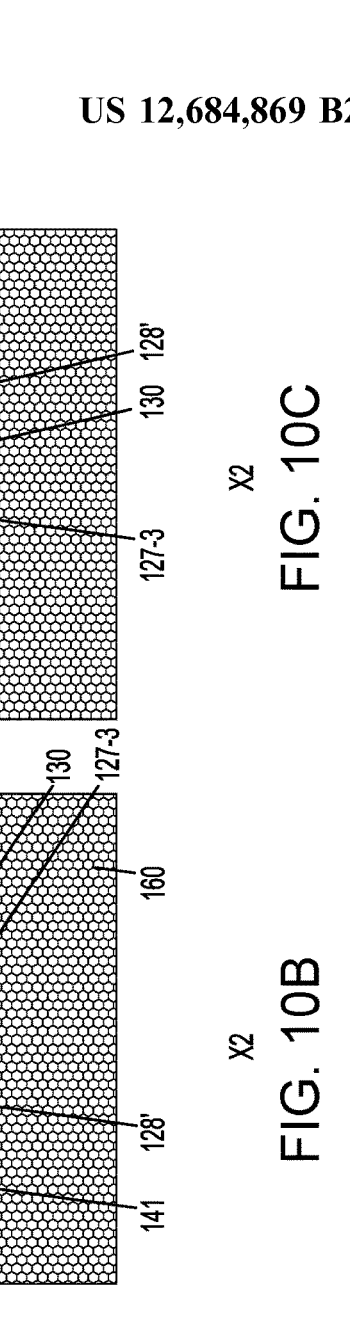
FIG. 10C
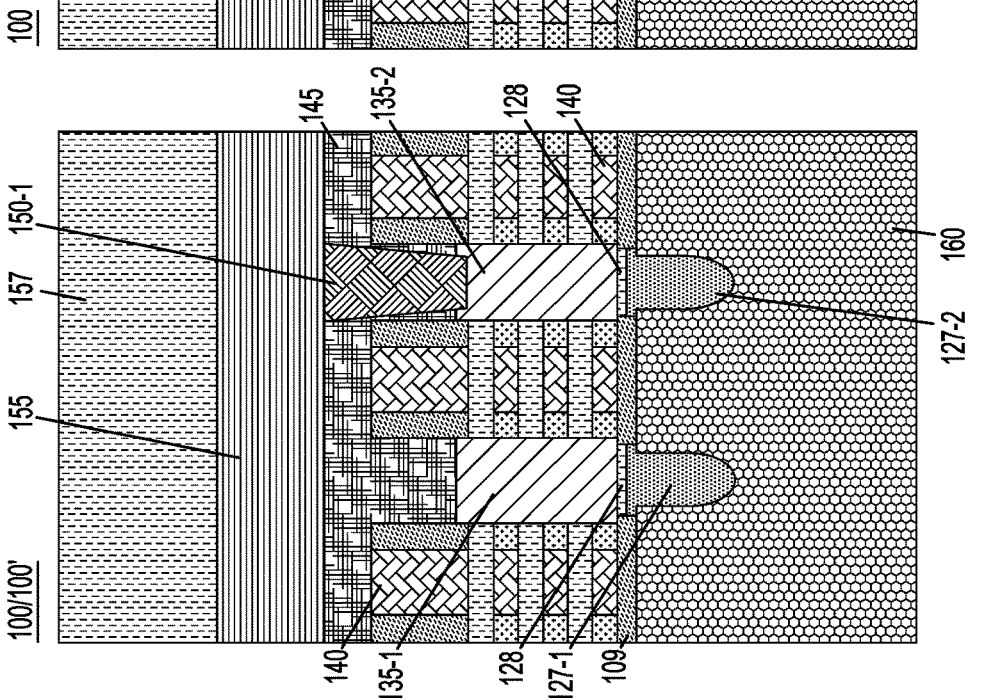
FIG. 10B
FIG. 10A

CONTACT PLACEHOLDER FORMATION FOR DIFFERENT DEVICE TYPES

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming contact placeholder layers for different device types.

In one embodiment, a semiconductor structure comprises at least one first nanosheet transistor disposed on a dielectric layer, the at least one first nanosheet transistor comprising at least one first source/drain region disposed on a side of the at least one first nanosheet transistor. At least one second nanosheet transistor is disposed on the dielectric layer, the at least one second nanosheet transistor comprising at least one second source/drain region disposed on a side of the at least one second nanosheet transistor, wherein the at least one second source/drain region has a larger dimension along a given direction than a dimension of the at least one first source/drain region along the given direction. One of a dielectric fill layer and an air gap is disposed in the dielectric layer and under the at least one second source/drain region. A semiconductor layer is disposed under the at least one second source/drain region, in the dielectric layer and around the one of the dielectric fill layer and the air gap.

In another embodiment, a semiconductor structure comprises a first device disposed on a dielectric layer and comprising a first source/drain region and a first plurality of gate structures alternately stacked with a first plurality of channel layers, a second device disposed on the dielectric layer and comprising a second source/drain region and a second plurality of gate structures alternately stacked with a second plurality of channel layers. The second source/drain region and the second plurality of channel layers respectively have larger dimensions along a given direction than dimensions of the first source/drain region and the first plurality of channel layers along the given direction. One of a dielectric fill layer and an air gap is disposed in the dielectric layer and under the second source/drain region, and a semiconductor layer is disposed under the second source/drain region and around the one of the dielectric fill layer and the air gap.

In another embodiment, a semiconductor structure comprises at least one nanosheet transistor disposed on a dielectric layer, the at least one nanosheet transistor comprising at least one source/drain region disposed on a side of the at least one nanosheet transistor. One of a dielectric fill layer and an air gap is disposed in the dielectric layer and under the at least one source/drain region, and a semiconductor layer is disposed under the at least one source/drain region, in the dielectric layer and around the one of the dielectric fill layer and the air gap.

These and other features and advantages of embodiments described herein will become more apparent from the accompanying drawings and the following detailed description.

BRIEF DESCRIPTION OF THE DRAWINGS

FIG. 10A depicts a first cross-sectional view corresponding to the line X1 in FIG. 1A following remaining semiconductor substrate removal from the FIG. 9A structure and backside inter-layer dielectric (ILD) layer formation and planarization in the high-density device region, according to an embodiment of the invention.

FIG. 10B depicts a second cross-sectional view corresponding to the line X2 in FIG. 1B following remaining semiconductor substrate removal from the FIG. 9B structure and backside ILD layer formation and planarization in the high-performance device region, according to an embodiment of the invention.

FIG. 10C depicts a third cross-sectional view corresponding to the line X2 in FIG. 1B following remaining semiconductor substrate removal from the FIG. 9C structure and backside ILD layer formation and planarization in the high-performance device region, according to an embodiment of the invention.

DETAILED DESCRIPTION

Figures 1A, 1B, 2A, 2B:
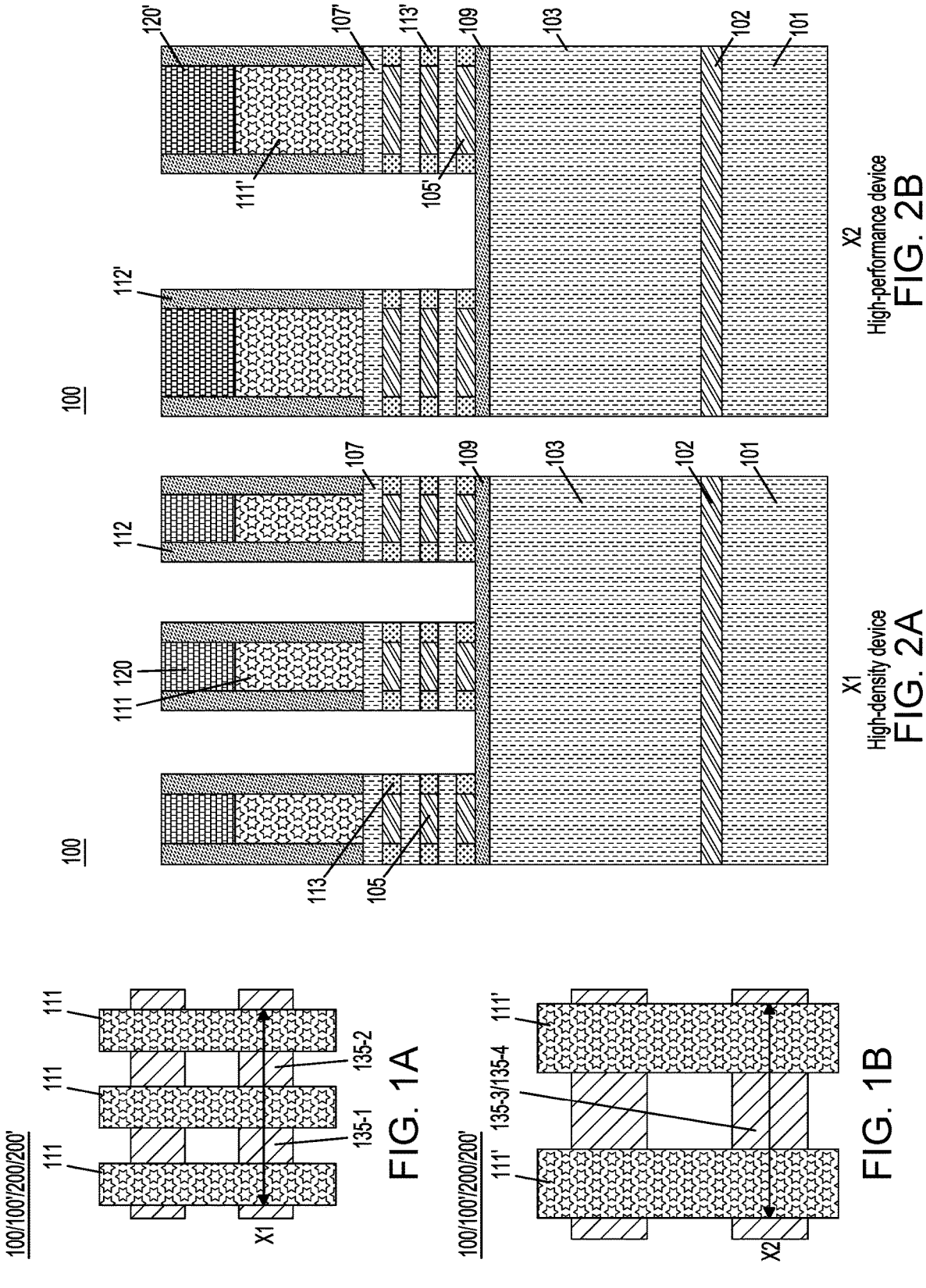
FIG. 1A depicts a top view of a semiconductor structure with line X1 on which the cross-sectional views of FIGS. 2A, 3A, 4A, 5A, 6A, 7A, 8A, 9A, 10A, 11A, 12A, 13A, 14A, 15A, 16A, 17A, 18A and 19A are based, according to an embodiment of the invention.
FIG. 1B depicts a top view of the semiconductor structure with line X2 on which the cross-sectional views of FIGS. 2B, 3B, 4B, 5B, 6B, 7B, 7C, 8B, 8C, 9B, 9C, 10B, 10C, 11B, 11C, 12B, 12C, 13B, 13C, 14B, 15B, 15C, 16B, 16C, 17B, 17C, 18B, 18C, 19B and 19C are based, according to an embodiment of the invention.
FIG. 2A depicts a first cross-sectional view corresponding to the line X1 in FIG. 1A following nanosheet layer patterning, isolation region formation, dummy gate formation, bottom dielectric isolation (BDI) layer formation, gate spacer formation and inner spacer formation in a high-density device region, according to an embodiment of the invention.
FIG. 2B depicts a second cross-sectional view corresponding to the line X2 in FIG. 1B following nanosheet layer patterning, isolation region formation, dummy gate formation, BDI layer formation, gate spacer formation and inner spacer formation in a high-performance device region, according to an embodiment of the invention.

Illustrative embodiments of the invention may be described herein in the context of illustrative methods for forming contact placeholder layers for different device types, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Various techniques may be used to reduce the size of FETs. One technique is through the use of fin-shaped channels in FinFET devices. Before the advent of FinFET arrangements, CMOS devices were typically substantially planar along the surface of the semiconductor substrate, with the exception of the FET gate disposed over the top of the channel. FinFETs utilize a vertical channel structure, increasing the surface area of the channel exposed to the gate. Thus, in FinFET structures the gate can more effectively control the channel, as the gate extends over more than one side or surface of the channel. In some FinFET arrangements, the gate encloses three surfaces of the three-dimensional channel, rather than being disposed over just the top surface of a traditional planar channel.

Another technique useful for reducing the size of FETs is through the use of stacked nanosheet channels formed over a semiconductor substrate. Stacked nanosheets may be two-dimensional nanostructures, such as sheets having a thickness range on the order of 1 to 100 nanometers (nm). Nanosheets and nanowires are viable options for scaling to 7 nm and beyond. A general process flow for formation of a nanosheet stack involves selectively removing sacrificial layers, which may be formed of silicon germanium (SiGe), between sheets of channel material, which may be formed of silicon (Si).

For continued scaling (e.g., to 2.5 nm and beyond), next-generation stacked FET devices may be used. Next-generation stacked FET devices provide a complex gate-allaround (GAA) structure. Conventional GAA FETs, such as nanosheet FETs, may stack multiple p-type nanowires or nanosheets on top of each other in one device, and may stack multiple n-type nanowires or nanosheets on top of each other in another device. Next-generation stacked FET structures provide improved track height scaling, leading to structural gains (e.g., such as 30-40% structural gains for different types of devices, such as logic devices, static random-access memory (SRAM) devices, etc.). In next-generation stacked FET structures, n-type and p-type nanowires or nanosheets are stacked on each other, eliminating n-to-p separation bottlenecks and reducing the device area footprint. There is, however, a continued desire for further scaling and reducing the size of FETs.

As discussed above, various techniques may be used to reduce the size of FETs, including through the use of fin-shaped channels in FinFET devices, through the use of stacked nanosheet channels formed over a semiconductor substrate, and next-generation stacked FET devices.

Although embodiments of the present invention are discussed in connection with nanosheet stacks, the embodiments of the present invention are not necessarily limited thereto, and may similarly apply to nanowire stacks.

FIG. 1A depicts a top view of a semiconductor structure with line X1 on which the cross-sectional views of FIGS. 2A, 3A, 4A, 5A, 6A, 7A, 8A, 9A, 10A, 11A, 12A, 13A, 14A, 15A, 16A, 17A, 18A and 19A are based, and FIG. 1B depicts a top view of the semiconductor structure with line X2 on which the cross-sectional views of FIGS. 2B, 3B, 4B, 5B, 6B, 7B, 7C, 8B, 8C, 9B, 9C, 10B, 10C, 11B, 11C, 12B, 12C, 13B, 13C, 14B, 15B, 15C, 16B, 16C, 17B, 17C, 18B, 18C, 19B and 19C are based. FIGS. 1A and 1B illustrate dummy gate portions 111 and 111' and source/drain regions 135-1, 135-2, 135-3 and 135-3 (collectively, "source/drain regions 135"), which are described in more detail herein in connection with, for example, FIGS. 2A, 2B, 6A and 6B.

Referring to FIGS. 2A and 2B, a semiconductor structure 100 in a high-density device region includes stacked nanosheet structures of sacrificial layers 105 and channel layers 107, and the semiconductor structure 100 in the high-performance device region includes stacked nanosheet structures of sacrificial layers 105' and channel layers 107'. In an illustrative embodiment, the sacrificial layers 105/105' comprise silicon germanium (SiGe) and the channel layers 107/107' comprise silicon. In illustrative embodiments, the sacrificial layers 105/105' comprise a germanium concentration of about 30% (e.g., SiGe30), but the embodiments are not necessarily limited to SiGe30 for the sacrificial layers 105/105'. The lowermost sacrificial layers 105/105' are formed on a bottom dielectric isolation (BDI) layer 109.

Referring to FIGS. 2A and 2B, first and second semiconductor substrates 101 and 103 comprise semiconductor material including, but not limited to, silicon (Si), III-V, II-V compound semiconductor materials or other like semiconductor materials. In addition, multiple layers of the semiconductor materials can be used as the semiconductor material of the first and second semiconductor substrates 101 and 103. The first and second semiconductor substrates 101 and 103 may also be referred herein to as first and second semiconductor substrates 101 and 103. An etch stop layer 102 is formed on the first semiconductor substrate 101, and may comprise, for example, silicon oxide ($SiO_x$) (where x is for example, 2, 1.99 or 2.01), or silicon germanium (SiGe). The second semiconductor substrate 103 comprising, for example, the same semiconductor material as the first semiconductor substrate 101, or other like semiconductor material, is formed on the etch stop layer 102.

According to one or more embodiments, the etch stop layer 102 is epitaxially grown on the first semiconductor substrate 101 and the second semiconductor substrate 103 is epitaxially grown on the etch stop layer 102. The sacrificial layers 105/105' and channel layers 107/107' are epitaxially grown in an alternating and stacked configuration on an additional sacrificial layer (not shown), which is replaced by the BDI layer 109. A first sacrificial layer 105/105' is followed by a first channel layer 107/107' on the first sacrificial layer 105/105', which is followed by a second sacrificial layer 105/105' on the first channel layer 107/107', and so on. As can be understood, the sacrificial and channel layers 105/105' and 107/107' are epitaxially grown from their corresponding underlying semiconductor layers.

While three sacrificial layers 105'/105' and three channel layers 107/107' are shown, the embodiments of the present invention are not necessarily limited to the shown number of sacrificial and channel layers 105/105' and 107/107', and there may be more or less layers in the same alternating configuration depending on design constraints. The sacrificial layers 105/105', as described further herein, are eventually removed and replaced by gate structures.

Although SiGe is described as a sacrificial material for sacrificial layers 105/105', other materials can be used as long as the sacrificial layers 105/105' have the property of being able to be removed selectively compared to the material of the channel layers 107/107'.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a metal-organic chemical vapor deposition (MOCVD), rapid thermal chemical vapor deposition (RT-CVD), ultra-high vacuum chemical vapor deposition (UHVCVD), or a low pressure chemical vapor deposition (LPCVD) apparatus. A number of different sources may be used for the epitaxial deposition of the in situ doped semiconductor material. In some embodiments, the gas source for the deposition of an epitaxially formed semiconductor material may include silicon (Si) deposited from silane, disilane, trisilane, tetrasilane, hexachlorodisilane, tetrachlorosilane, dichlorosilane, trichlorosilane, and combinations thereof. In other examples, when the semiconductor material includes germanium, a germanium gas source may be selected from the group consisting of germane, digermane, halogermane, dichlorogermane, trichlorogermane, tetrachlorogermane and combinations thereof. The temperature for epitaxial deposition typically ranges from 450° C. to 900° C. Although higher temperature typically results in faster deposition, the faster deposition may result in crystal defects and film cracking.

In a non-limiting illustrative embodiment, a height (vertical height in the cross-sectional views) of the sacrificial layers 105/105' can be in the range of about 6 nm to about 15 nm depending on the application of the device. Also, in a non-limiting illustrative embodiment, a height of the channel layers 107/107' can be in the range of about 6 nm to about 15 nm depending on the desired process and application. In accordance with an embodiment of the present invention, in the high-density device region each of the channel layers 107 has the same or substantially the same composition and size as each other, and each of the sacrificial layers 105 has the same or substantially the same composition and size as each other. In the high-performance device region, each of the channel layers 107' has the same or substantially the same composition and size as each other, and each of the sacrificial layers 105' has the same or substantially the same composition and size as each other.

In the high-density device region, dummy gate portions 111 are formed on the uppermost channel layers 107 and around the stacked nanosheet configurations of the sacrificial layers 105 and channel layers 107. In the high-performance device region, dummy gate portions 111' are formed on the uppermost channel layers 107' and around the stacked nanosheet configurations of the sacrificial layers 105' and channel layers 107'. The dummy gate portions 111/111' include, but are not necessarily limited to, an amorphous silicon (a-Si) layer. The dummy gate portions 111/111' are deposited using deposition techniques such as, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), sputtering and/or plating, followed by a planarization process, such as, chemical mechanical planarization (CMP), and lithography and etching steps to remove excess dummy gate material, and pattern the deposited layer. Hardmask layers 120 are formed on the dummy gate portions 111 in the high-density device region, and hardmask layers 120' are formed on the dummy gate portions 111' in the high-performance device region. The hardmask layers 120/120' comprise, for example, a nitride such as SiN or other nitride material.

Due to the germanium in sacrificial layers 105/105', lateral etching of the sacrificial layers 105/105' can be performed selective to channel layers 107/107', such that the side portions of the sacrificial layers 105/105' can be removed to create vacant areas to be filled in by inner spacers 113 in the high-density device region and inner spacers 113' in the high-performance device region. The material of the inner spacers 113/113' can comprise, but is not necessarily limited to, a nitride, such as, SiN, SiON, SiCN, BN, SiBN, SiBCN or SiOCN. In the high-density device region, gate spacers 112 are positioned on the nanosheet stacks on opposite lateral sides of the dummy gate portions 111, and in the high-density device region, gate spacers 112' are positioned on the nanosheet stacks on opposite lateral sides of the dummy gate portions 111'. The gate spacers 112/112' are formed from the same or similar material to that of the inner spacers 113/113'. The inner and gate spacers 113/113' and 112/112' can be formed by any suitable techniques such as deposition followed by directional etching. Deposition may include, but is not limited to, ALD or CVD. Directional etching may include but is not limited to, reactive ion etching (RIE). Although not shown, dielectric isolation regions (e.g., shallow trench isolation (STI) regions) are formed between the nanosheet stacks, and portions of the BDI layer 109, and the second semiconductor substrate 103. The BDI layer 109 may comprise, for example, silicon nitride (SiN), silicon oxynitride (SiON), silicon-carbon-nitride (SiCN), boron nitride (BN), silicon boron nitride (SiBN), silicoboron carbonitride (SiBCN), silicon oxycarbonitride (SiOCN) and combinations thereof.

As can be seen in FIGS. 1A, 1B, 2A and 2B, the nanosheet stacks, dummy gate portions 111 and hardmask layers 120 in the high-density device region are narrower (e.g., have a smaller horizontal width) than the nanosheet stacks, dummy gate portions 111' and hardmask layers 120' in the high-performance device region. In more detail, the sacrificial layers 105 and channel layers 107 in the high-density device region are narrower (e.g., have a smaller horizontal width) than the sacrificial layers 105' and channel layers 107' in the high-performance device region. In addition, referring to FIGS. 2A and 2B, the horizontal distance between the nanosheet stacks is smaller in the high-density device region than in the high-performance device region. As a result, as explained in more detail herein, resulting source/drain regions 135-1 and 135-2 between the nanosheet stacks in the high-density device region have smaller widths (e.g., horizontal distance in the cross-sectional and top views) than resulting source/drain regions 135-3 and 135-4 between the nanosheet stacks in the high-performance device region.

As used herein, "frontside or "first side" refers to a side on top of the first and second semiconductor substrates 101 and 103 and/or in front of, on top of or in an upward direction from the stacked nanosheet/gate and channel layers of the transistors in the orientation shown in the cross-sectional figures. As used herein, "backside" or "second side" refers to a side below the first and/or second semiconductor substrates 101 and 103 and/or behind, below or in a downward direction from the stacked nanosheet/gate and channel layers of the transistors in the orientation shown in the cross-sectional figures (e.g., opposite the "frontside").

Figure 3B:
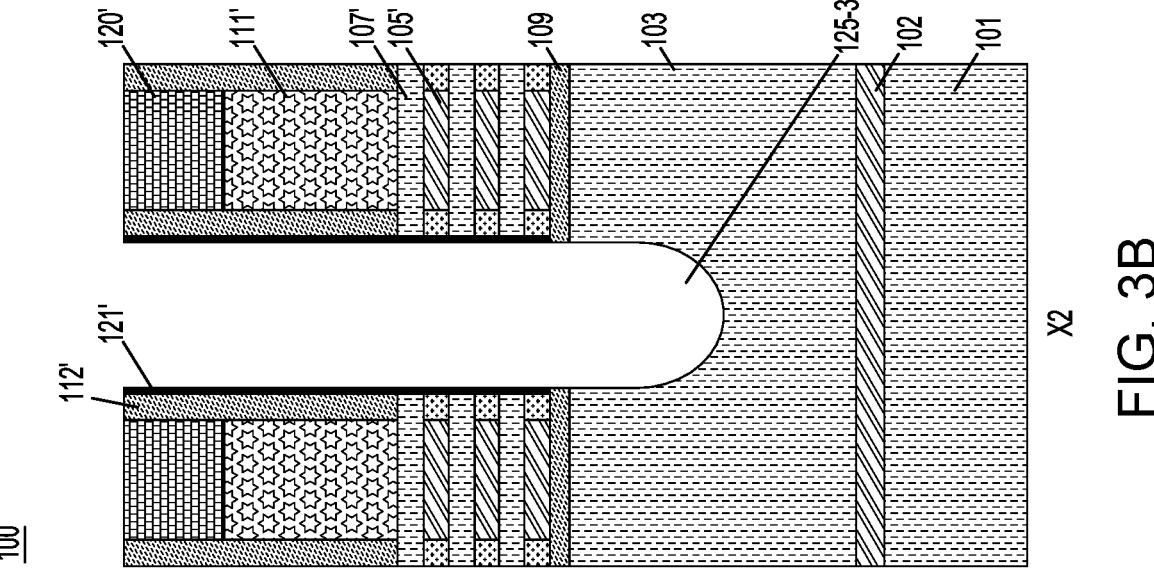
FIG. 3B depicts a second cross-sectional view corresponding to the line X2 in FIG. 1B following protective liner formation and substrate recessing in the high-performance device region, according to an embodiment of the invention.
Figure 3A:
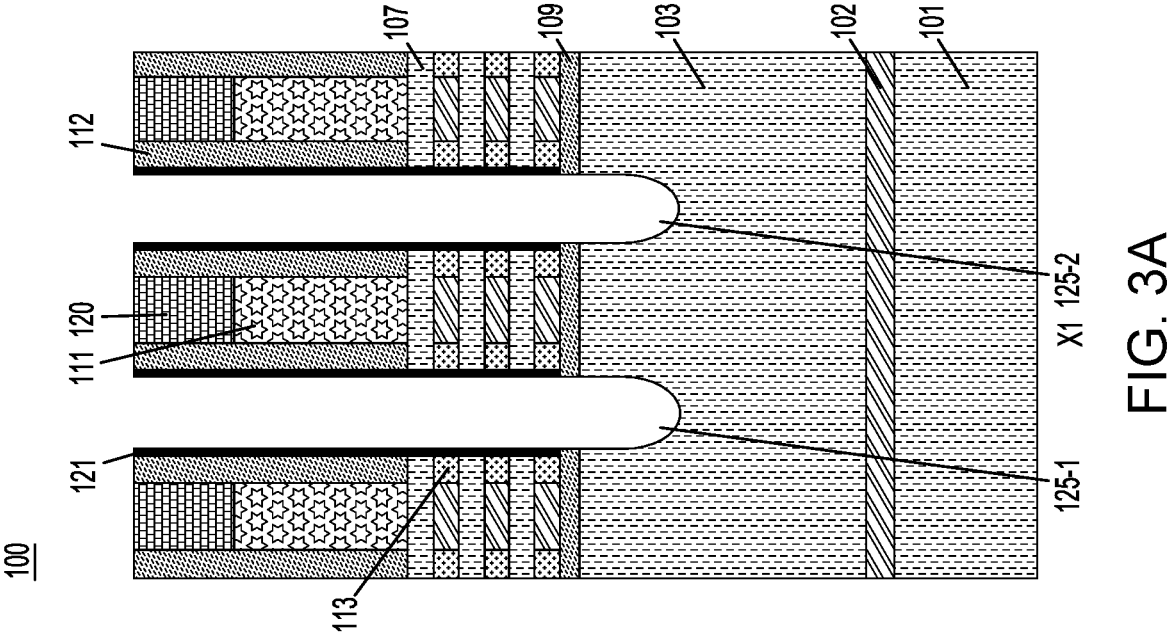
FIG. 3A depicts a first cross-sectional view corresponding to the line X1 in FIG. 1A following protective liner formation and substrate recessing in the high-density device region, according to an embodiment of the invention.

Referring to FIGS. 3A and 3B, in the high-density device region, protective liner layers 121 are formed on sides of the nanosheet stacks including the channel layers 107, gate spacers 112 and inner spacers 113, and in the high-performance device region, protective liner layers 121' are formed on sides of the nanosheet stacks including the channel layers 107', gate spacers 112' and inner spacers 113'. The protective liner layers 121/121' are formed from, for example, SiN. In an illustrative embodiment, a thickness of the protective liner layers 121/121' is about 20 angstroms. The protective liner layers 121/121' can be formed by any suitable techniques such as deposition followed by directional etching. Deposition may include, but is not limited to, ALD or CVD. Directional etching may include but is not limited to RIE.

An etching process such as, for example, RIE, is performed on exposed portions of the BDI layer 109 and underlying portions of the second semiconductor substrate 103 to form openings 125-1, 125-2 and 125-3 (e.g., trenches) (collectively, "openings 125") in the second semiconductor substrate 103. As can be seen, the openings 125-1 and 125-2 in the high-density device region are narrower (e.g., have a smaller horizontal width) than the opening 125-3 in the high-performance device region. The openings 125 are formed by etching through parts of the BDI layer 109 and parts of the second semiconductor substrate 103. The openings 125 comprise a U-shape.

Figure 4B:
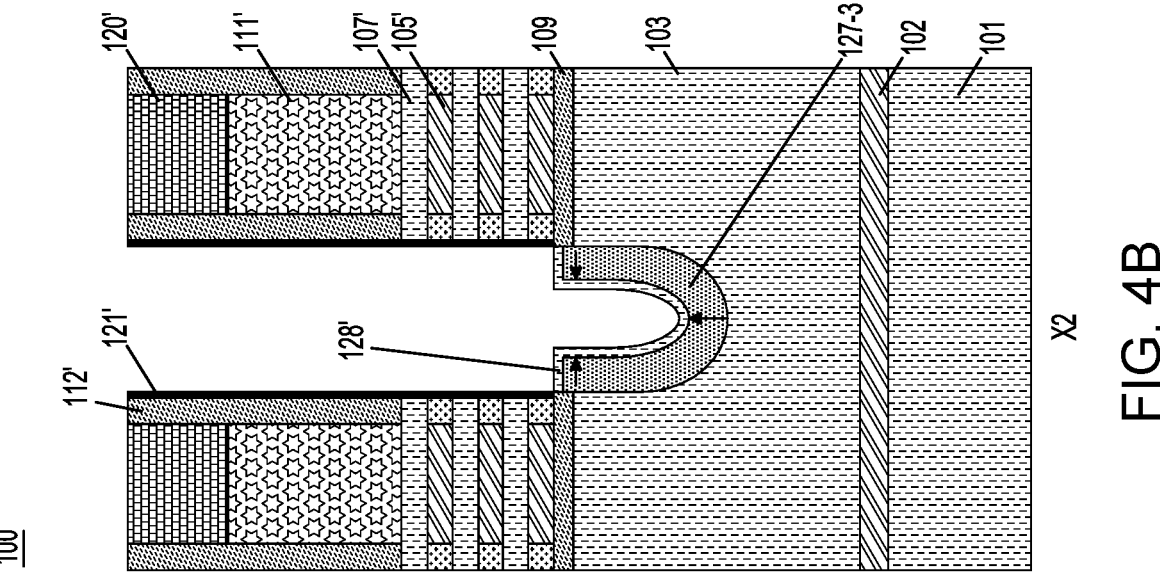
FIG. 4B depicts a second cross-sectional view corresponding to the line X2 in FIG. 1B following placeholder semiconductor layer and buffer semiconductor layer formation in the high-performance device region, according to an embodiment of the invention.
Figure 4A:
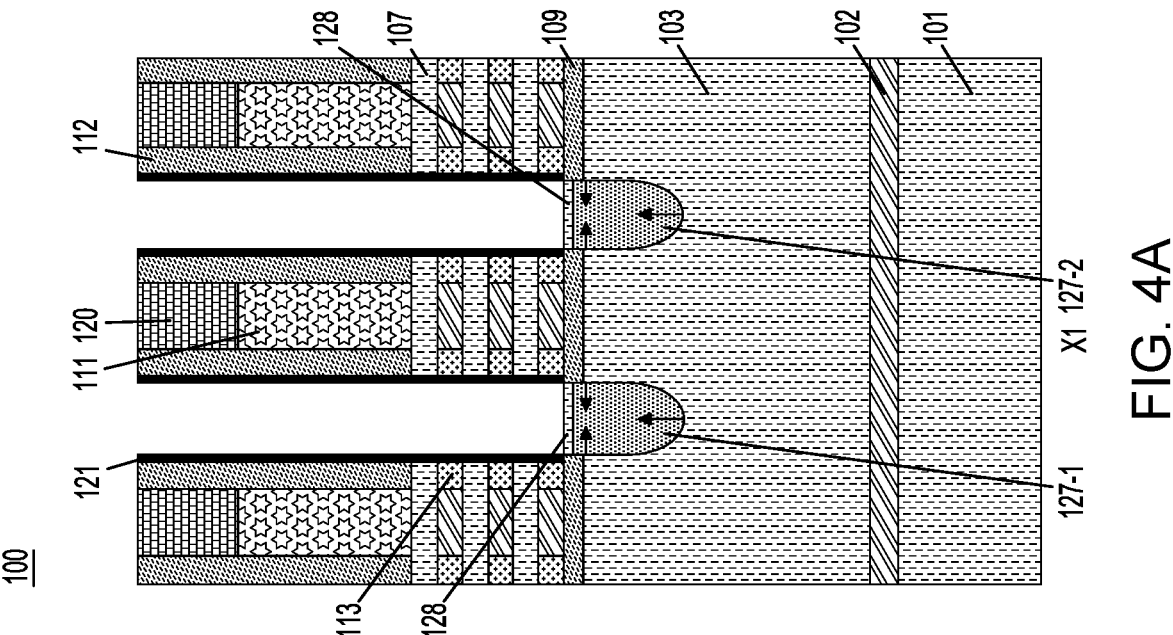
FIG. 4A depicts a first cross-sectional view corresponding to the line X1 in FIG. 1A following placeholder semiconductor layer and buffer semiconductor layer formation in the high-density device region, according to an embodiment of the invention.

Referring to FIGS. 4A and 4B, placeholder semiconductor layers 127-1 and 127-2 and buffer semiconductor layers 128 are formed in the high-density device region, and a placeholder semiconductor layer 127-3 and buffer semiconductor layer 128' are formed in the high-performance device region.

In illustrative embodiments, the placeholder semiconductor layers 127-1, 127-2 and 127-3 (collectively "placeholder semiconductor layers 127") comprise, for example, SiGe, III-V semiconductor material or other semiconductor material, and the buffer semiconductor layers 128/128' comprise, for example, silicon or other semiconductor material. The placeholder semiconductor layers 127 and buffer semiconductor layers 128/128' are epitaxially grown. As can be seen by the arrows in FIGS. 4A and 4B, the placeholder semiconductor layers 127 are epitaxially grown in multiple directions, which permits the top surfaces of the placeholder semiconductor layers 127 to be coplanar. Due to the larger size of the opening 125-3, unlike the placeholder semiconductor layers 127-1 and 127-2 in the high-density device region, the placeholder semiconductor layer 127-3 in the high-performance device region does not merge and empty space remains in the opening 125-3. The buffer semiconductor layers 128/128' are epitaxially grown from the exposed surfaces of their corresponding placeholder semiconductor layers 127-1, 127-2 and 127-3. In more detail, the buffer semiconductor layers 128 are grown from top surfaces of the placeholder semiconductor layers 127-1 and 127-2, and the buffer semiconductor layer 128' is grown from exposed top, side, lower surfaces of the placeholder semiconductor layer 127-3 to form a U-shape similar to the U-shape of the placeholder semiconductor layer 127-3. The epitaxial growth of placeholder semiconductor layer 127-3 follows the inner profile of opening 125-3, and the epitaxial growth of buffer semiconductor layer 128' follows the profile of placeholder semiconductor layer 127-3.

Figure 5B:
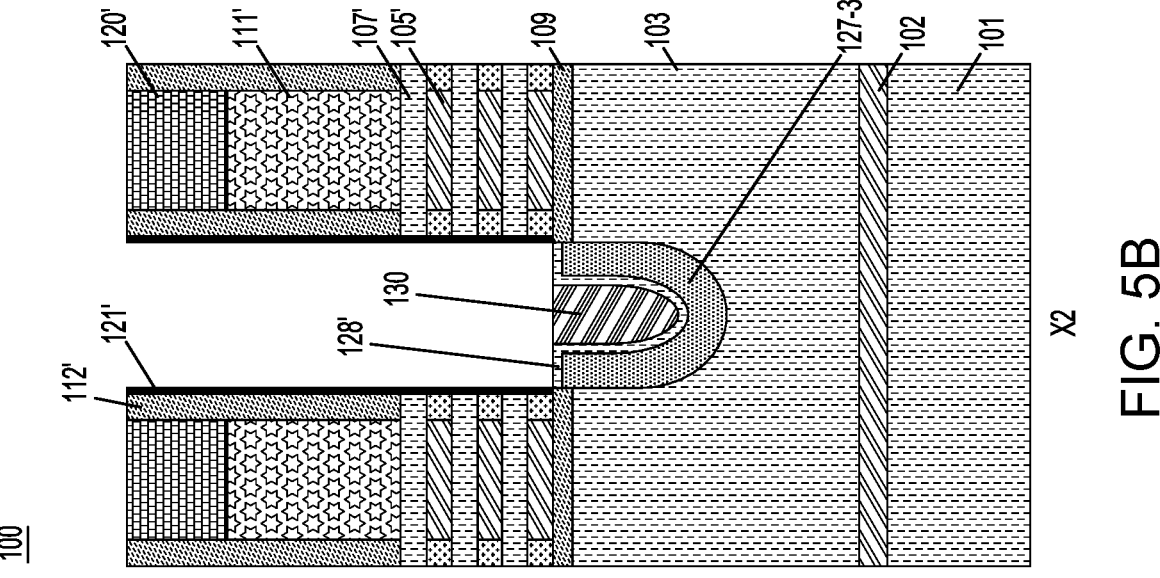
FIG. 5B depicts a second cross-sectional view corresponding to the line X2 in FIG. 1B following placeholder dielectric fill layer formation in the high-performance device region, according to an embodiment of the invention.
Figure 5A:
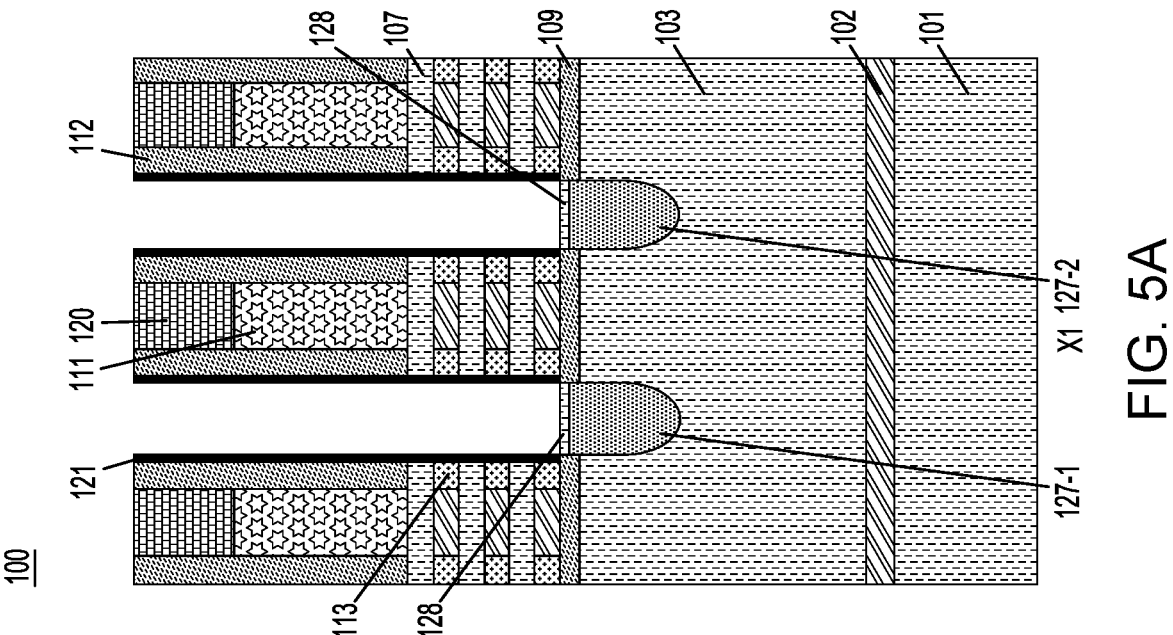
FIG. 5A depicts a first cross-sectional view corresponding to the line X1 in FIG. 1A illustrating maintaining of the structure from FIG. 4A in the high-density device region, according to an embodiment of the invention.

Referring to FIG. 5B, in order to fill in the remaining empty space in the opening 125-3 not occupied by the placeholder semiconductor layer 127-3 or buffer semiconductor layer 128', placeholder dielectric fill layer 130 is deposited in the remaining empty space in the opening 125-3. The placeholder dielectric fill layer 130 is deposited in the opening 125-3 on the buffer semiconductor layer 128' using deposition techniques such as, for example, CVD, PECVD, RFCVD, PVD, ALD, MBD, PLD, and/or LSMCD, followed by an etching process to recess the placeholder dielectric fill layer 130 to a height such that top surface of the placeholder dielectric fill layer 130 is coplanar with or substantially coplanar with top surfaces of the buffer semiconductor layer 128'.

Figure 6B:
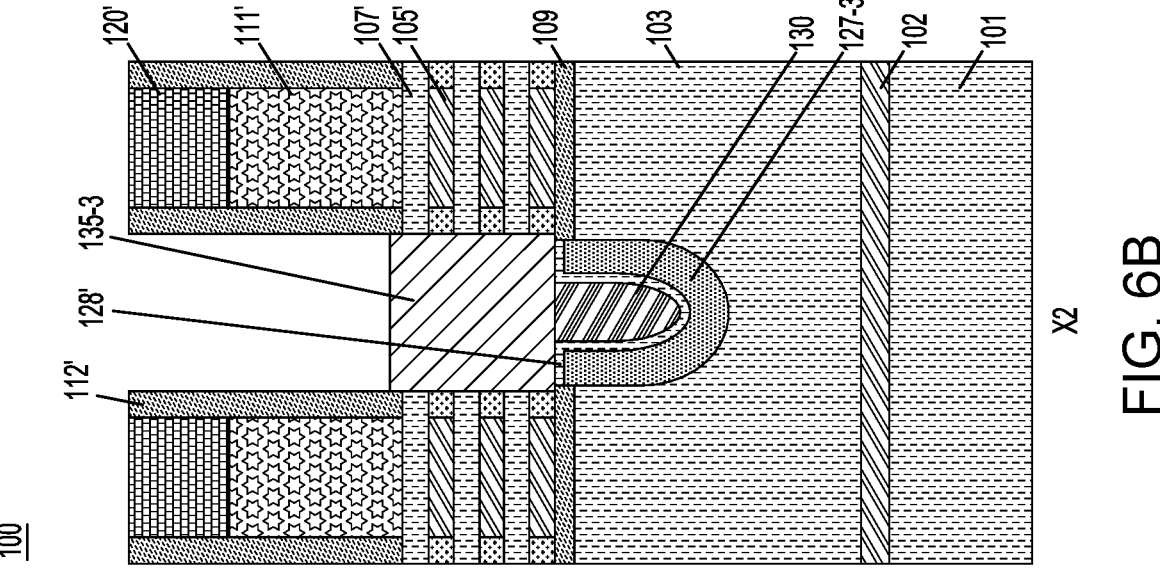
FIG. 6B depicts a second cross-sectional view corresponding to the line X2 in FIG. 1B following epitaxial source/drain region formation in the high-performance device region, according to an embodiment of the invention.
Figure 6A:
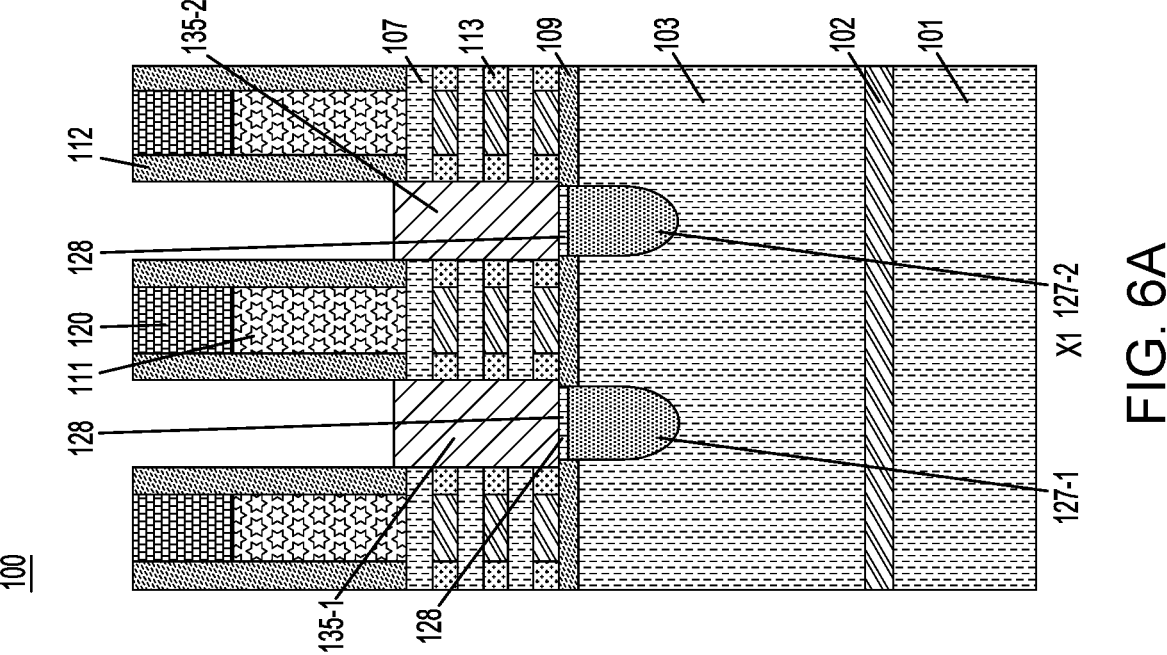
FIG. 6A depicts a first cross-sectional view corresponding to the line X1 in FIG. 1A following epitaxial source/drain region formation in the high-density device region, according to an embodiment of the invention.

Referring to FIGS. 6A and 6B, the protective liner layers 121/121' are removed using, for example, an isotropic dry or wet etch process, and source/drain regions 135-1, 135-2 and 135-3 are epitaxially grown between the nanosheet stacks in the high-density device and high-performance device regions. The source/drain regions 135 comprise epitaxial layers grown from sides of channel layers 107/107', as well as from the top surfaces of the buffer semiconductor layers 128/128'. As can be seen, the source/drain regions 135-1 and 135-2 in the high-density device region are narrower (e.g., have a smaller horizontal dimension (width)) than the source/drain region 135-3 in the high-performance device region.

Figures 7A, 7B, 7C:
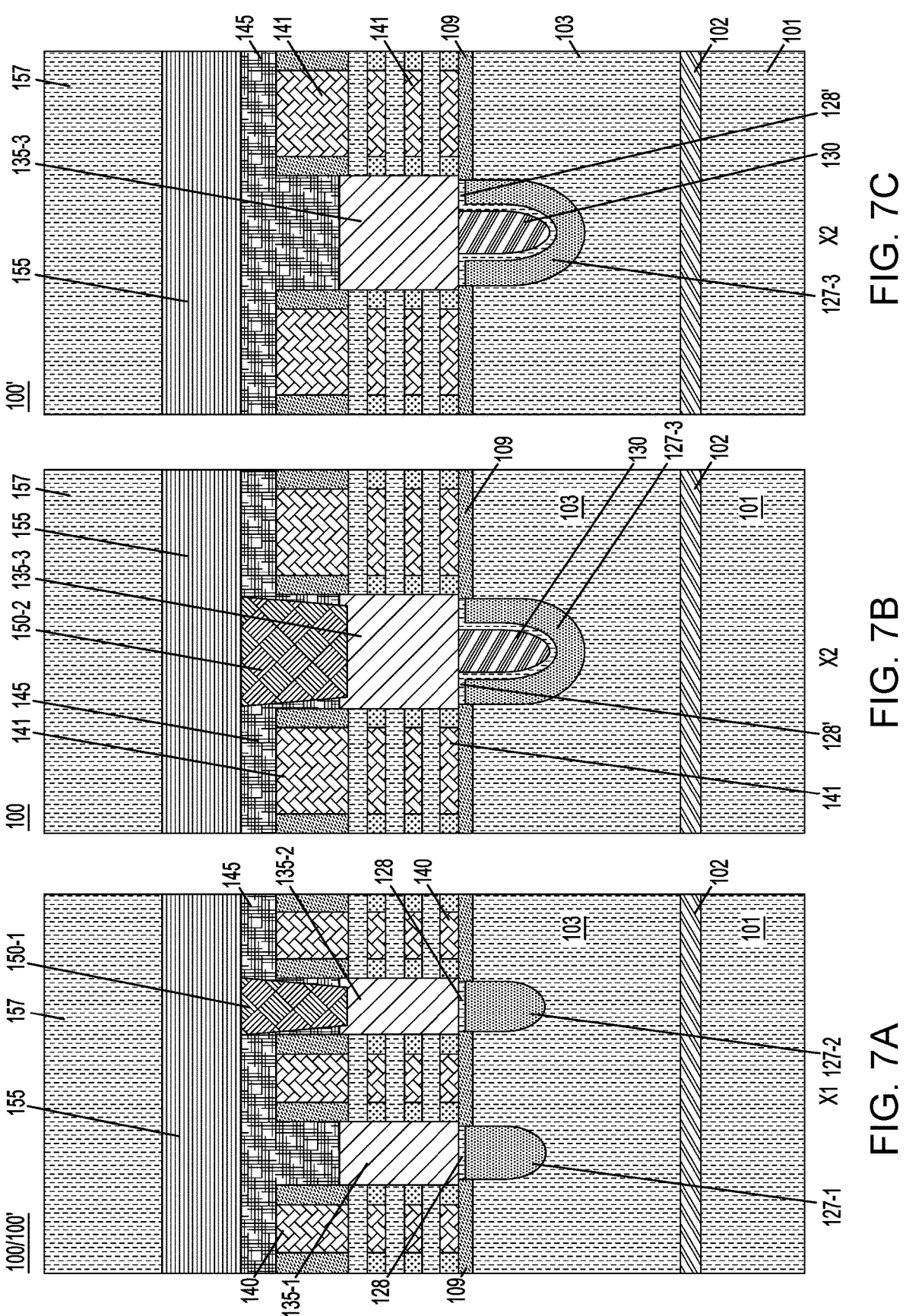
FIG. 7A depicts a first cross-sectional view corresponding to the line X1 in FIG. 1A following replacement metal gate (RMG) formation, middle-of-line (MOL) contact formation, back-end-of-line (BEOL) interconnect formation and carrier wafer bonding in the high-density device region, according to an embodiment of the invention.
FIG. 7B depicts a second cross-sectional view corresponding to the line X2 in FIG. 1B following RMG formation, MOL contact formation, BEOL interconnect formation and carrier wafer bonding in the high-performance device region, according to an embodiment of the invention.
FIG. 7C depicts a third cross-sectional view corresponding to the line X2 in FIG. 1B following RMG formation, BEOL interconnect formation and carrier wafer bonding with no MOL contact formation, in the high-performance device region, according to an embodiment of the invention.

FIGS. 7A and 7B depict RMG formation, MOL contact formation, BEOL interconnect formation and carrier wafer bonding in the high-density and high-performance device region. FIG. 7C depicts an embodiment of a semiconductor structure 100' similar to the semiconductor structure 100, but without with a frontside MOL source/drain contact to the source/drain region 135-3 in the high-performance device region. Referring to FIGS. 7A-7C, an inter-layer dielectric (ILD) layer 145 is deposited to fill in portions on and around the source/drain regions 135-1, 135-2 and 135-3. The ILD layer 145 is deposited using deposition techniques such as, for example, CVD, PECVD, RFCVD, PVD, ALD, MBD, PLD, and/or LSMCD, followed by a planarization process, such as, CMP to remove excess portions of the ILD layer 145 deposited on top of the hardmask layers 120/120' and gate spacers 112/112', and to remove the hardmask layers 120/120' and portions of the gate spacers 112/112' to expose the dummy gate portions 111/111'. The ILD layer 145 may comprise, for example, $SiO_x$, SiOC, SiOCN or some other dielectric material.

The dummy gate portions 111/111' are selectively removed to create vacant areas where gate structures will be formed in place of the dummy gate portions 111/111'. The selective removal can be performed using, for example, hot ammonia to remove a-Si. In addition, the sacrificial layers 105/105' are selectively removed to create vacant areas where gate structures will be formed in place of the sacrificial layers 105/105'. The sacrificial layers 105/105' are selectively removed with respect to the channel layers 107/107'. The selective removal can be performed using, for example, a dry HCl etch.

Following removal of the dummy gate portions 111/111' and sacrificial layers 105/105', the channel layers 107/107' are suspended, and gate structures 140 and 141 are formed in the high-density and high-performance device regions, respectively. The gate structures 140 and 141 include, for example, gate and dielectric portions formed in the vacant portions left by removal of the dummy gate portions 111/111', and the sacrificial layers 105/105'. In illustrative embodiments, each gate structure 140/141 includes a gate dielectric layer such as, for example, a high-K dielectric layer including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum oxide). Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. According to an embodiment, the gate structures 140/141 each include a metal gate portion including a work-function metal (WFM) layer, including but not necessarily limited to, for a pFET, titanium nitride (TiN), tantalum nitride (TaN) or ruthenium (Ru), and for an nFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN, which can be deposited on the gate dielectric layer. The metal gate portions can also each further include a gate metal layer including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof deposited on the WFM layer and the gate dielectric layer. It should be appreciated that various other materials may be used for the metal gate portions as desired.

Referring to FIGS. 7A and 7B, in the semiconductor structure 100, frontside source/drain contacts 150-1 and 150-2 are formed in the ILD layer 145 on source/drain regions 135-2 and 135-3 in the high-density and high-performance device regions, respectively. The semiconductor structure 100' depicts an embodiment without a frontside source/drain contact on the source/drain region 135-3. In the embodiment in FIG. 7A, a frontside source/drain contact is not formed on the source/drain region 135-1. In forming the frontside source/drain contacts 150-1 and 150-2, openings are formed through portions of the ILD layer 145. The openings expose portions of the source/drain regions 135-2 and 135-3 on which the frontside source/drain contacts 150-1 and 150-2 are to be formed. According to an embodiment, masks are formed on parts of the ILD layer 145, and exposed portions of the ILD layer 145 corresponding to where the openings are to be formed are removed using, for example, a dry etching process using a RIE or ion beam etch (IBE) process, a wet chemical etch process or a combination of these etching processes. A dry etch may be performed using a plasma. Such wet or dry etch processes include, for example, IBE by Ar/CHF3 based chemistry.

Metal layers are deposited in the openings to form the frontside source/drain contacts 150-1 and 150-2. The metal layers comprise, for example, a silicide layer, such as Ni, Ti, NiPt, etc., a metal adhesion layer, such as TiN, and a conductive metal fill layer, such as W, Al, Co, Ru, etc., and can be deposited using, for example, a deposition technique such as CVD, PECVD, RFCVD, PVD, ALD, MBD, PLD, LSMCD, sputtering and/or plating, followed by a planarization process such as, CMP to remove excess portions of the metal layers from on top of the ILD layer 145. The frontside source/drain contacts 150-1 and 150-2 contact respective ones of the source/drain regions 135-2 and 135-3. The frontside source/drain contacts 150-1 and 150-2 extend through the ILD layer 145 to land on and contact the corresponding source/drain regions 135-2 and 135-2.

In the semiconductor structures 100 and 100', frontside BEOL interconnects 155 are formed on the ILD layer 145 including the frontside source/drain contacts 150-1 and 150-2. As can be seen, the frontside source/drain contacts 150-1 and 150-2 contact and are electrically connected to the frontside BEOL interconnects 155. A carrier wafer 157 is bonded to the frontside BEOL interconnects 155. The frontside BEOL interconnects 155 include various BEOL interconnect structures which may electrically connect to the frontside source/drain contacts 150-1 and 150-2. The carrier wafer 157 may be formed of materials similar to that of the first and second semiconductor substrates 101 and 103, and may be formed over the frontside BEOL interconnects 155 using a wafer bonding process, such as dielectric-to-dielectric bonding.

Figures 8A, 8B, 8C:
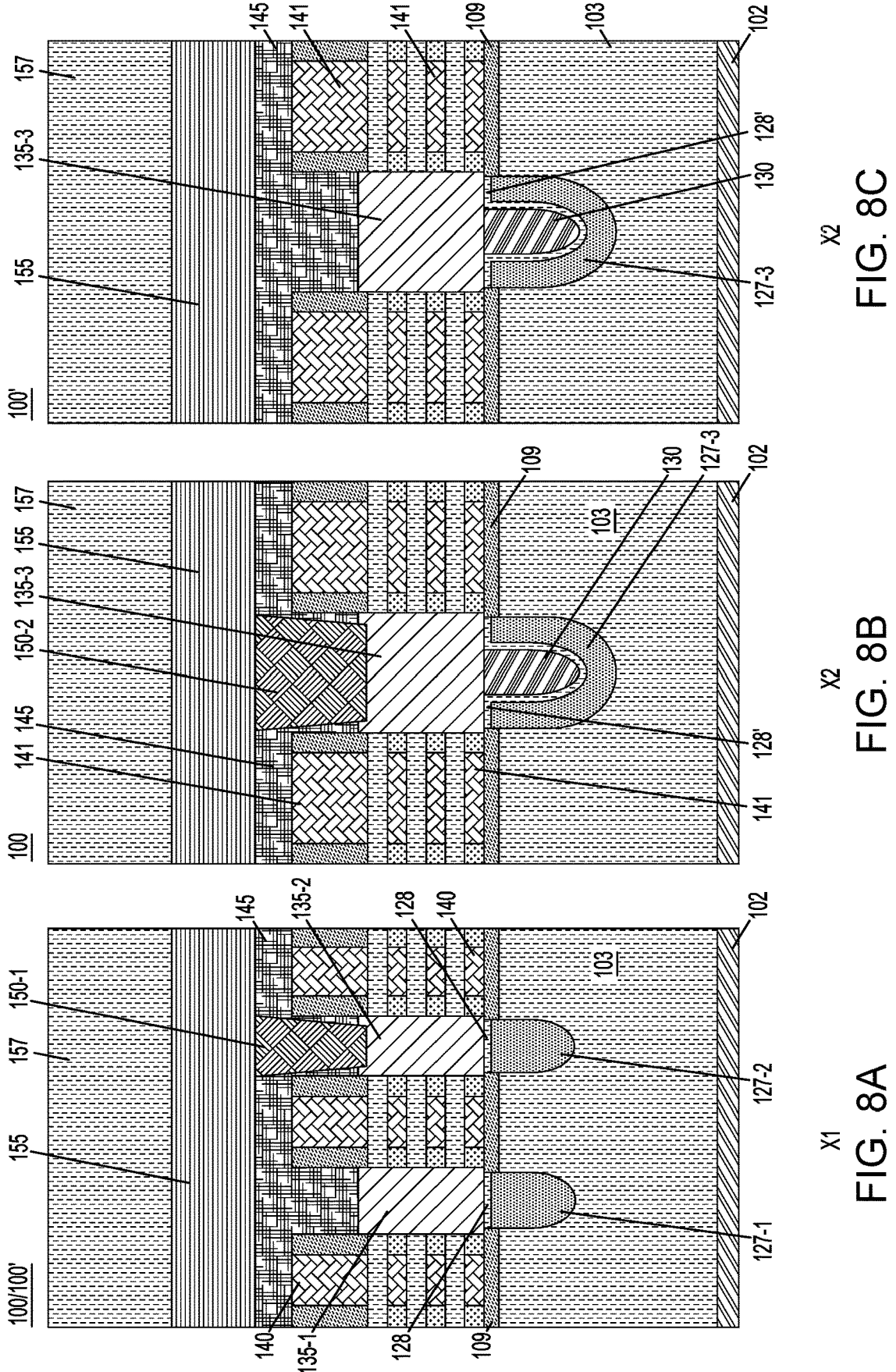
FIG. 8A depicts a first cross-sectional view corresponding to the line X1 in FIG. 1A following wafer flipping and semiconductor substrate removal from the FIG. 7A structure in the high-density device region, according to an embodiment of the invention.
FIG. 8B depicts a second cross-sectional view corresponding to the line X2 in FIG. 1B following wafer flipping and semiconductor substrate removal from the FIG. 7B structure in the high-performance device region, according to an embodiment of the invention.
FIG. 8C depicts a third cross-sectional view corresponding to the line X2 in FIG. 1B following wafer flipping and semiconductor substrate removal from the FIG. 7C structure in the high-performance device region, according to an embodiment of the invention.
Figures 9A, 9B, 9C:
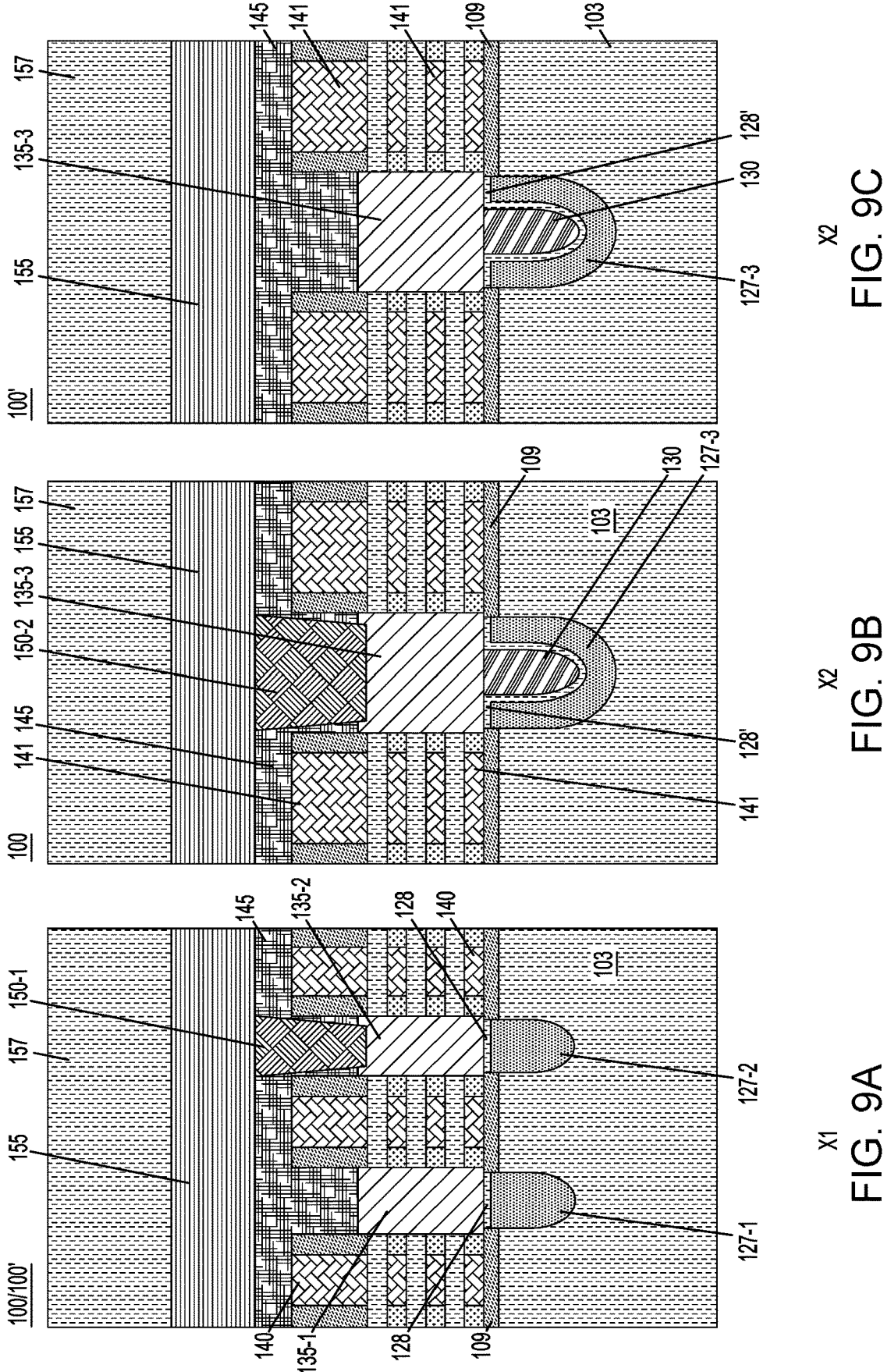
FIG. 9A depicts a first cross-sectional view corresponding to the line X1 in FIG. 1A following etch stop layer removal from the FIG. 8A structure in the high-density device region, according to an embodiment of the invention.
FIG. 9B depicts a second cross-sectional view corresponding to the line X2 in FIG. 1B following etch stop layer removal from the FIG. 8B structure in the high-performance device region, according to an embodiment of the invention.
FIG. 9C depicts a third cross-sectional view corresponding to the line X2 in FIG. 1B following etch stop layer removal from the FIG. 8C structure in the high-performance device region, according to an embodiment of the invention.

Referring to FIGS. 8A-8C, using the carrier wafer 157, the semiconductor structures 100/100' may be "flipped" (e.g., rotated 180 degrees) so that the structures are inverted. In addition, the first semiconductor substrate 101 is removed from the backside of the semiconductor structures 100/100'. The removal process, which comprises etching of the first semiconductor substrate 101, stops at the etch stop layer 102 as illustrated in FIGS. 8A-8C. For example, the first semiconductor substrate 101 is selectively etched with an etchant that selectively etches silicon with respect to a material of the etch stop layer 102 (e.g., SiO$_2$ or SiGe).

Referring to FIGS. 9A-9C and 10A-10C, the etch stop layer 102 and the second semiconductor substrate 103 (e.g., silicon layer) are removed from the semiconductor structures 100/100'. As part of the removal of the second semiconductor substrate 103, portions of the placeholder semiconductor layers 127-1, 127-2 and 127-3 are removed so that the sizes/areas of the placeholder semiconductor layers 127-1, 127-2 and 127-3 are reduced. The etch stop layer 102 is removed, followed by removal of the second semiconductor substrate 103, wherein portions of the BDI layer 109, and the placeholder semiconductor layers 127-1, 127-2 and 127-3 are exposed. Etching processes for removal of the etch stop layer 102 include, for example, IBE by Ar/CHF3 based chemistry.

Referring to FIGS. 10A-10C, a backside ILD layer 160 is deposited to fill in areas formerly occupied by the second semiconductor substrate 103. The backside ILD layer 160 is deposited using deposition techniques such as, for example, CVD, PECVD, RFCVD, PVD, ALD, MBD, PLD, and/or LSMCD, followed by a planarization process, such as, CMP to remove excess portions of the backside ILD layer 160. The backside ILD layer 160 may comprise, for example, SiO$_x$, SiOC, SiOCN or some other dielectric material.

Figures 11A, 11B, 11C:
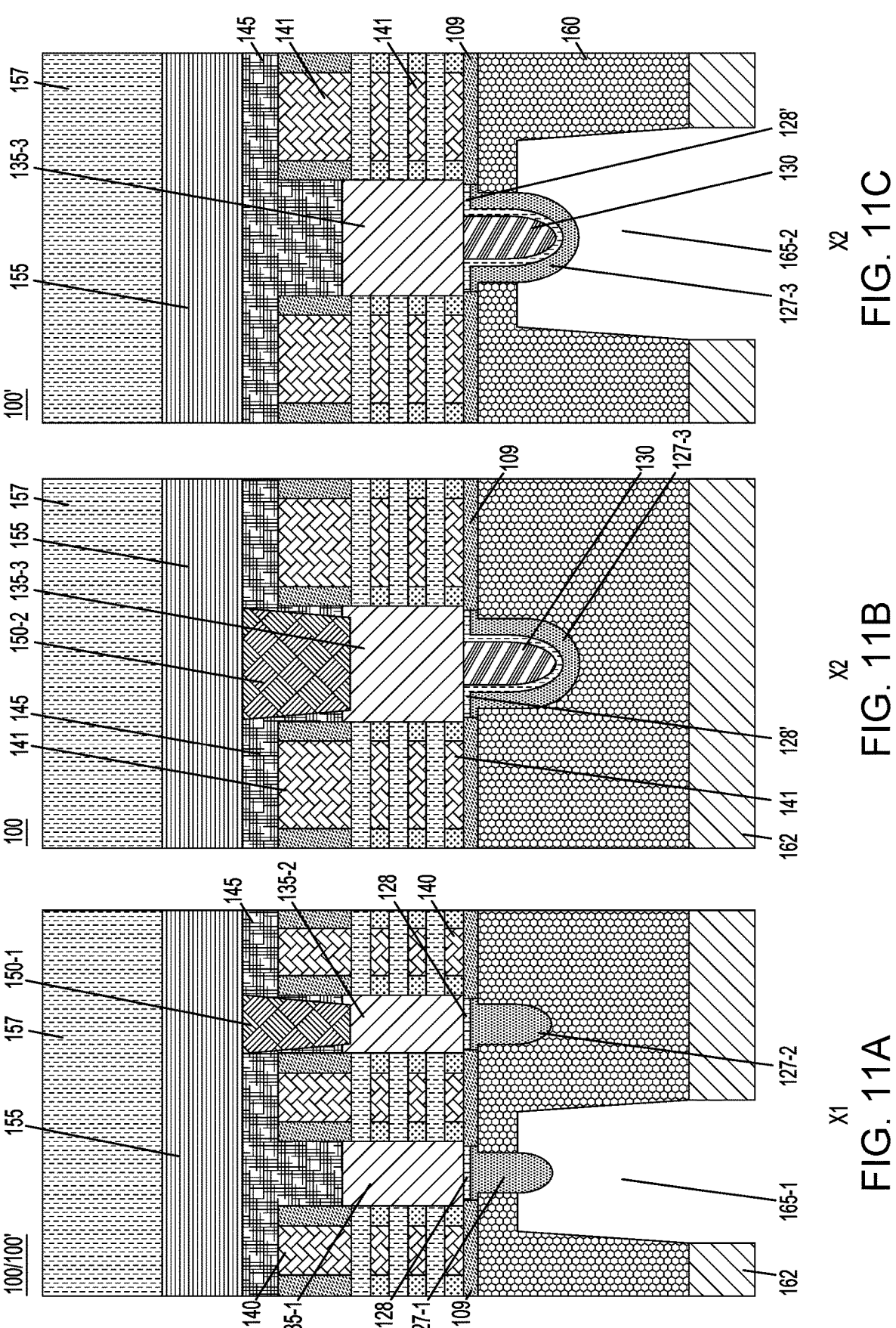
FIG. 11A depicts a first cross-sectional view corresponding to the line X1 in FIG. 1A following organic planarization layer (OPL) formation on and backside contact patterning of the FIG. 10A structure in the high-density device region, according to an embodiment of the invention.
FIG. 11B depicts a second cross-sectional view corresponding to the line X2 in FIG. 1B following OPL formation on the FIG. 10B structure with no backside contact patterning in the high-density device region in the high-performance device region, according to an embodiment of the invention.
FIG. 11C depicts a third cross-sectional view corresponding to the line X2 in FIG. 1B following OPL formation on and backside contact patterning of the FIG. 10C structure in the high-density device region in the high-performance device region, according to an embodiment of the invention.

Referring to FIGS. 11A-11C, an OPL 162 is formed on portions of the backside ILD layer 160. The OPL 162 comprises, but is not necessarily limited to, an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. The OPL 162 can be deposited, for example, by spin coating.

Openings are formed in the OPL 162 to expose portions of the backside ILD layer 160 corresponding to where backside source/drain contacts 170-1 and 170-2 (see FIGS. 13A and 13C) are to be formed. An etching process such as, for example, RIE, is performed via the openings in the OPL 162 to form openings 165-1 and 165-2 (e.g., trenches) in the backside ILD layer 160 where the backside source/drain contacts 170-1 and 170-2 will be formed. The openings 165-1 and 165-2 are formed by etching through part of backside ILD layer 160. The openings 165-1 and 165-2 expose the placeholder semiconductor layer 127-1 in the high-density device region in the embodiments corresponding to semiconductor structure 100 and 100', and placeholder semiconductor layer 127-3 in the high-performance device region in the embodiment corresponding semiconductor structure 100'. The portion of the backside ILD layer 160 corresponding to the placeholder semiconductor layer 127-3 in the high-performance device region in the embodiment corresponding semiconductor structure 100 is not removed since the source/drain region 135-3 in the embodiment corresponding to semiconductor structure 100 is already contacted by frontside source/drain contact 150-2. Similarly, the portion of the backside ILD layer 160 corresponding to the placeholder semiconductor layer 127-2 in the high-density device region is not removed since the source/drain region 135-2 is already contacted by frontside source/drain contact 150-1.

Figures 12A, 12B, 12C:
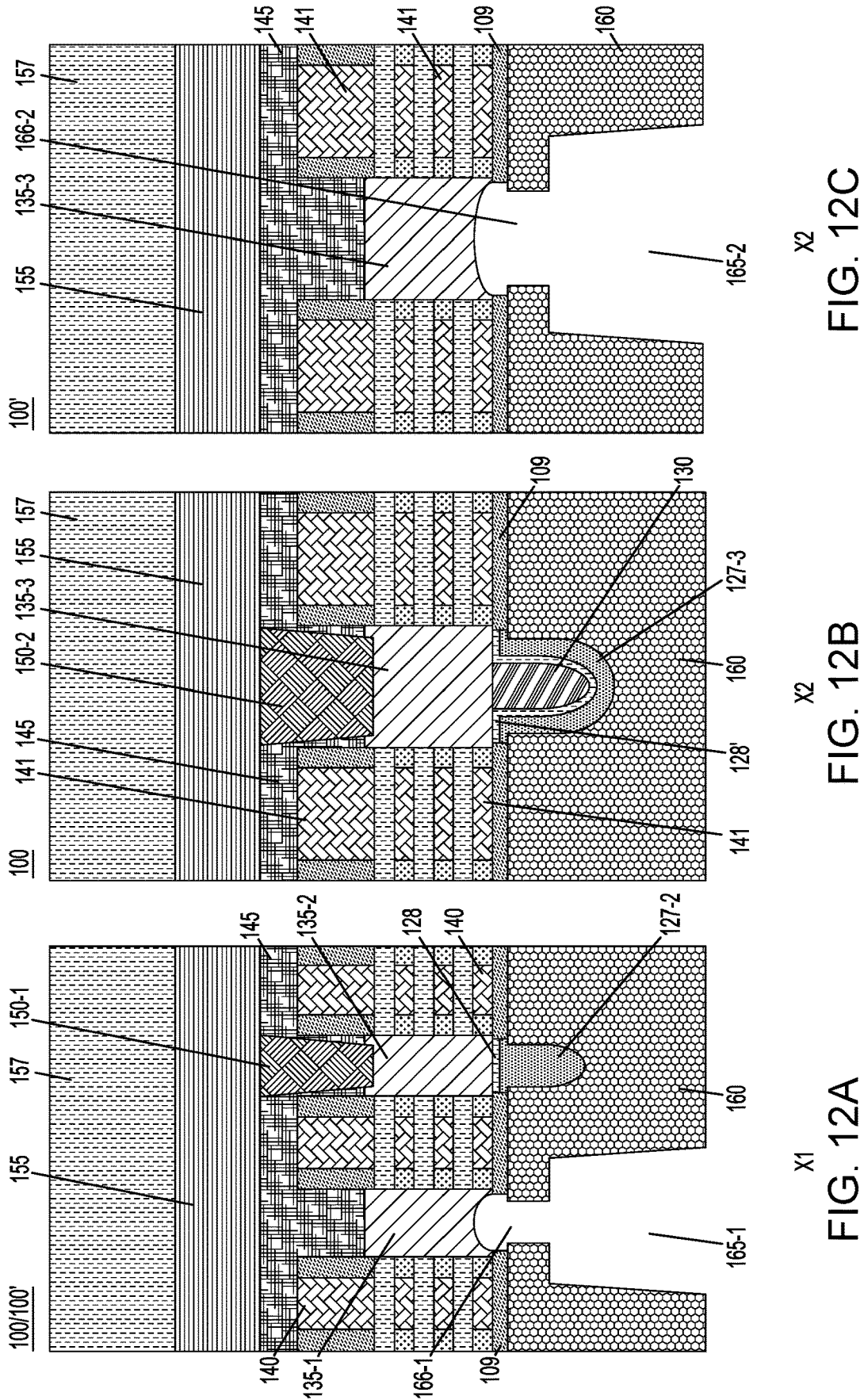
FIG. 12A depicts a first cross-sectional view corresponding to the line X1 in FIG. 1A following OPL and placeholder layer removal from the FIG. 11A structure and gouging of a source/drain region in the high-density device region, according to an embodiment of the invention.
FIG. 12B depicts a second cross-sectional view corresponding to the line X2 in FIG. 1B following OPL layer removal from the FIG. 11B structure in the high-density device region in the high-performance device region, according to an embodiment of the invention.
FIG. 12C depicts a third cross-sectional view corresponding to the line X2 in FIG. 1B following OPL and placeholder layer removal from the FIG. 11C structure and gouging of a source/drain region in the high-performance device region, according to an embodiment of the invention.

Referring to FIGS. 12A-12C, the OPL 162 is removed. The OPL 162 is stripped using, for example, oxygen plasma, nitrogen/hydrogen plasma or other carbon strip process. OPL stripping causes minimal or no damage to exposed layers. Referring to FIGS. 12A and 12C, the placeholder semiconductor layer 127-1 and corresponding buffer semiconductor layer 128 in the high-density device region and the placeholder semiconductor layer 127-3 and corresponding buffer semiconductor layer 128' in the high-performance device region in the embodiment corresponding semiconductor structure 100' are selectively removed to expose backside portions of the source/drain regions 135-1 and 135-3. In creating openings 166-1 and 166-2 caused by the removal of the placeholder semiconductor layers 127-1 and 127-3, and their corresponding buffer semiconductor layers 128 and 128', the backside portions of the source/drain regions 135-1 and 135-3 are optionally gouged to create arc-like shapes in the backside portions of the source/drain regions 135-1 and 135-3. The placeholder semiconductor layers 127-1 and 127-3, and their corresponding buffer semiconductor layers 128 and 128', are removed using, for example, a selective dry or wet etch process.

Figures 13A, 13B, 13C:
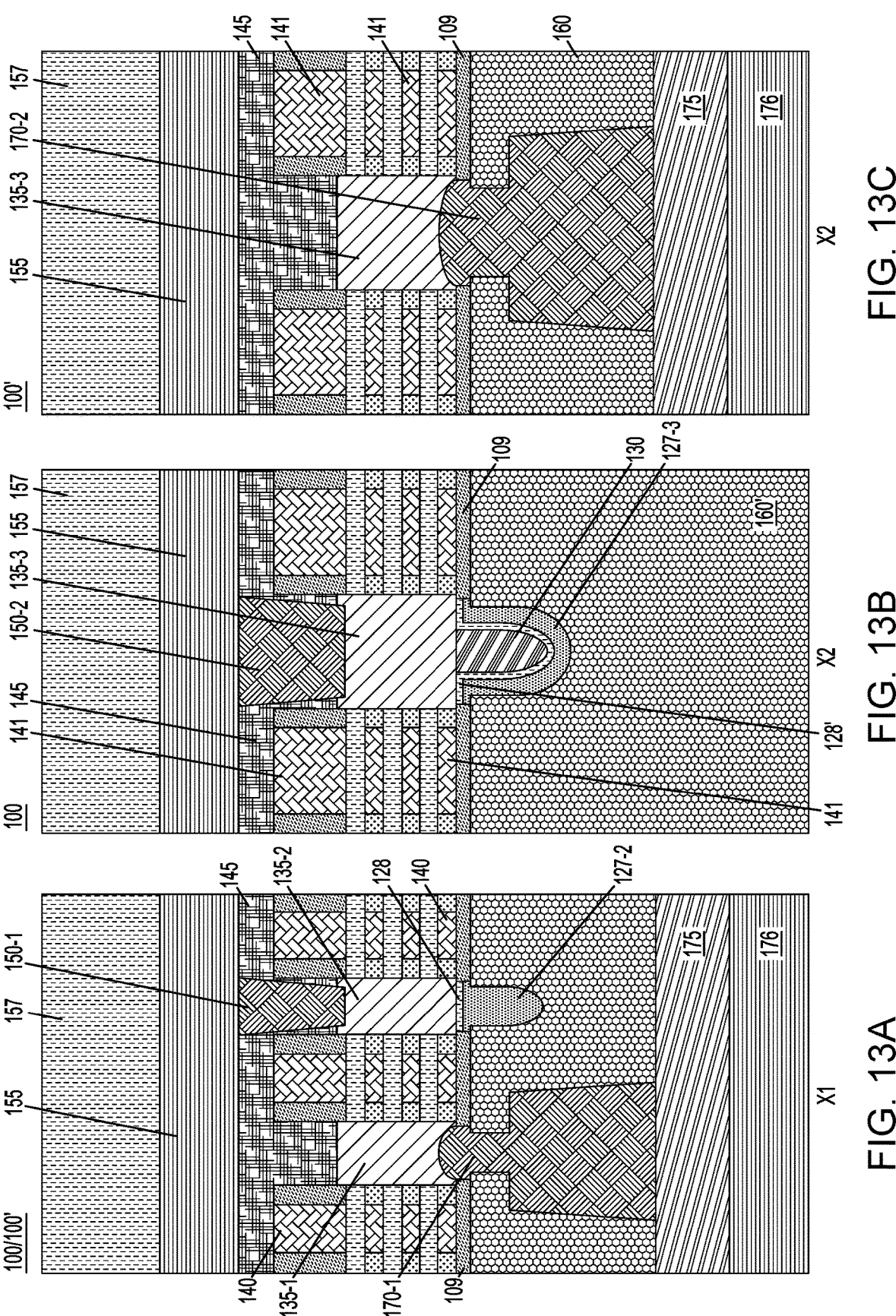
FIG. 13A depicts a first cross-sectional view corresponding to the line X1 in FIG. 1A following backside source/drain contact formation, backside power rail (BPR) formation and backside power delivery network (BSPDN) formation in the FIG. 12A structure in the high-density device region, according to an embodiment of the invention.
FIG. 13B depicts a second cross-sectional view corresponding to the line X2 in FIG. 1B following additional backside ILD layer formation on the FIG. 12B structure in the high-performance device region, according to an embodiment of the invention.
FIG. 13C depicts a third cross-sectional view corresponding to the line X2 in FIG. 1B following backside source/drain contact formation, BPR formation and BSPDN formation in the FIG. 12C structure in the high-performance device region, according to an embodiment of the invention.
Figure 14B:
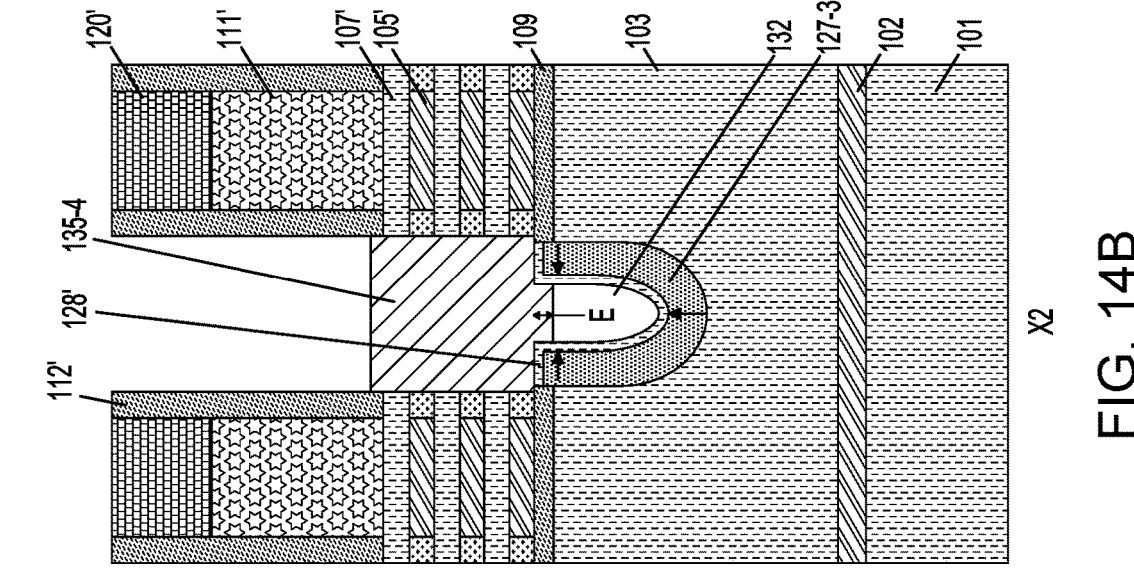
FIG. 14B depicts a second cross-sectional view corresponding to the line X2 in FIG. 1B following epitaxial source/drain region formation and placeholder air gap formation in the high-performance device region, according to an embodiment of the invention.
Figure 14A:
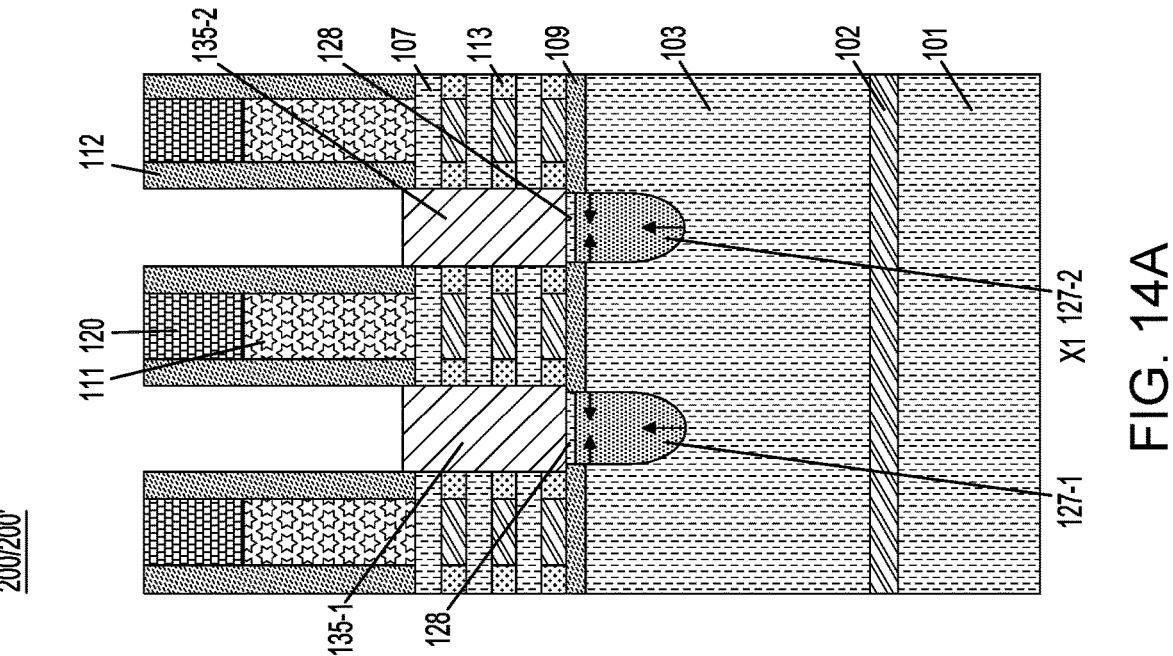
FIG. 14A depicts a first cross-sectional view corresponding to the line X1 in FIG. 1A following epitaxial source/drain region formation in the high-density device region, according to an embodiment of the invention.
Figures 15A, 15B, 15C:
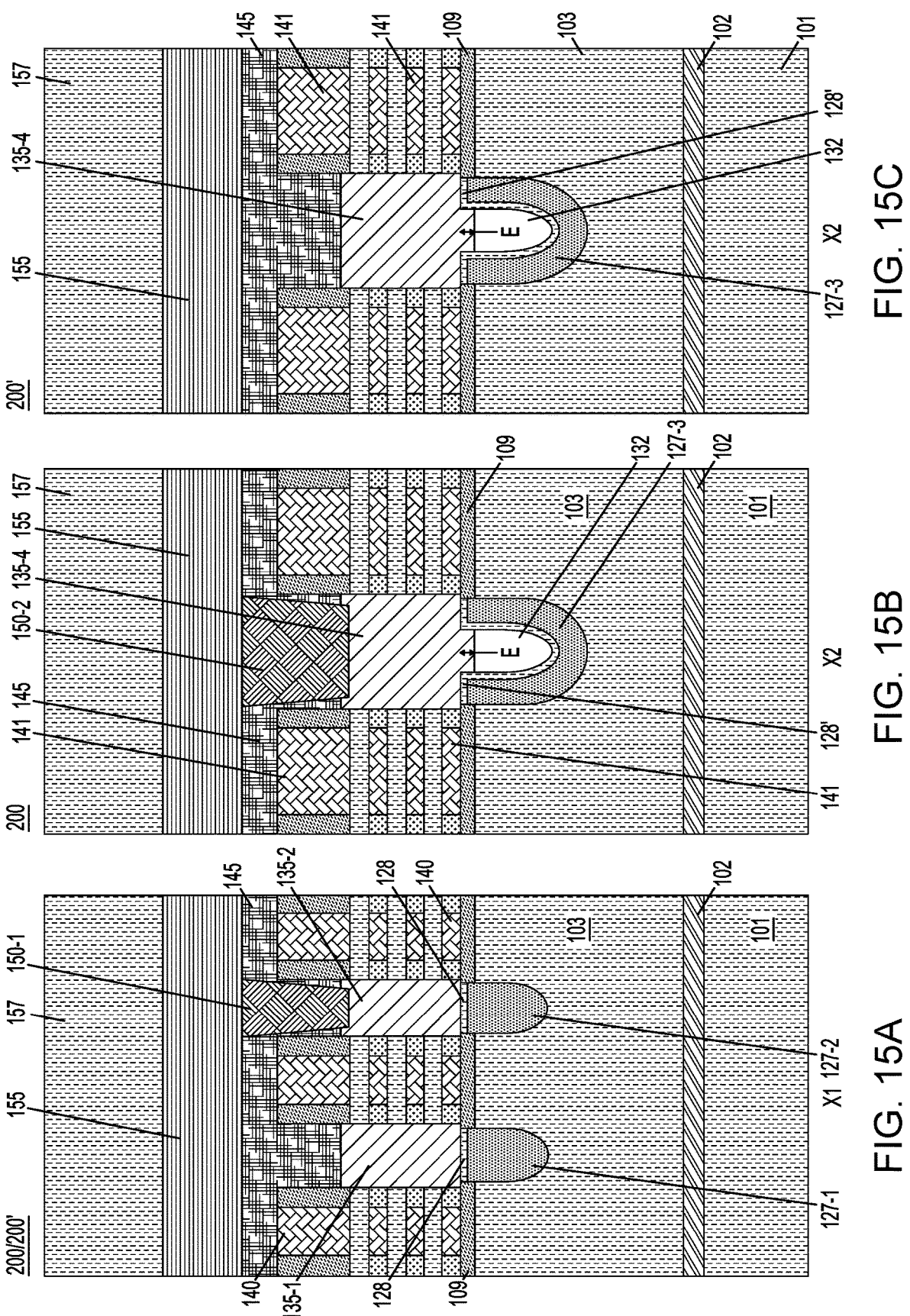
FIG. 15A depicts a first cross-sectional view corresponding to the line X1 in FIG. 1A following RMG formation, MOL contact formation, BEOL interconnect formation and carrier wafer bonding in the high-density device region, according to an embodiment of the invention.
FIG. 15B depicts a second cross-sectional view corresponding to the line X2 in FIG. 1B following RMG formation, MOL contact formation, BEOL interconnect formation and carrier wafer bonding in the high-performance device region, according to an embodiment of the invention.
FIG. 15C depicts a third cross-sectional view corresponding to the line X2 in FIG. 1B following RMG formation, BEOL interconnect formation and carrier wafer bonding with no MOL contact formation, in the high-performance device region, according to an embodiment of the invention.

Referring to FIGS. 13A and 13C, the backside source/ drain contacts 170-1 and 170-2 are formed in the backside ILD layer 160 in the openings 165-1, 166-1, 165-2 and 166-2. Metal layers are deposited in the openings 165-1, 166-1, 165-2 and 166-2 to form the backside source/drain contacts 170-1 and 170-2. The metal layers comprise, for example, a silicide layer, such as Ni, Ti, NiPt, etc., a metal adhesion layer, such as TiN, and a conductive metal fill layer, such as W, Al, Co, Ru, etc., and can be deposited using, for example, a deposition technique such as CVD, PECVD, RFCVD, PVD, ALD, MBD, PLD, LSMCD, sputtering and/or plating, followed by a planarization process such as, chemical mechanical planarization (CMP) to remove excess portions of the metal layers from on top of the backside ILD layer 160.

The backside source/drain contacts 170-1 and 170-2 contact respective backsides of the source/drain region 135-2 in semiconductor structures 100/100' and source/drain region 135-3 in semiconductor structure 100'. The backside source/ drain contacts 170-1 and 170-2 extend through the backside ILD layer 160 to land on and contact the backsides of the corresponding source/drain regions 135-2 and 135-3.

Referring to FIG. 13B, which depicts the high-performance device region of the semiconductor structure 100, additional backside ILD material is deposited to form an additional backside ILD layer 160' on the backside ILD layer 160. As shown in FIGS. 13A and 13C, a backside power rail 175 (e.g., conductive wires) is formed in portions of the additional backside ILD layer 160'. In forming the backside power rail 175, openings are formed through portions of the additional backside ILD layer 160'. The openings expose portions the backside source/drain contacts 170-1 and 170-2 on which the backside power rail 175 is formed.

The backside power rail 175 is formed in the additional backside ILD layer 160' by forming one or more trenches in the additional backside ILD layer 160' and filling the one or more trenches with conductive material. Trenches may be opened in the additional backside ILD layer 160' using, for example, lithography followed by RIE. The backside power rail 175 is formed in by filling the one or more trenches with conductive material, such as, for example, electrically conductive material including, but not necessarily limited to, tungsten, cobalt, zirconium, tantalum, titanium, aluminum, ruthenium, and/or copper. A liner layer (not shown) including, for example, titanium and/or titanium nitride, may be formed on side and bottom surfaces of the trenches before filling the trenches with the conductive material. Deposition of the conductive material can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

The backside source/drain contacts 170-1 and 170-2 contact the source/drain regions 135-2 and 135-3, respectively, and the backside power rail 175 is formed on and contacts the backside source/drain contacts 170-1 and 170-2. Backside power delivery network (BSPDN) layers 176 (also referred to herein as backside interconnects) are formed on the backside power rail 175. The BSPDN layers 176 include various BSPDN structures such as, but not necessarily limited to, interconnects in a power supply path from voltage regulator modules (VRMs) to circuits. The interconnects can comprise, for example, power and ground planes in circuit boards, cables, connectors and capacitors associated with a power supply. Backside power delivery prevents BEOL routing congestion, resulting in power performance benefits.

FIGS. 14A-19C correspond to semiconductor structures 200 and 200', which are the same as or similar to semiconductor structures 100 and 100'. In semiconductor structures, 200 and 200', unlike semiconductor structures 100 and 100', there is no dielectric fill layer 130 deposited to fill-in a remaining portion of the 125-3 in the high-performance device region where the placeholder semiconductor layer 127-3 did not merge after epitaxial growth. In more detail, referring to FIGS. 14A and 14B, in semiconductor structures 200/200', like semiconductor structures 100/100', placeholder semiconductor layers 127-1 and 127-2 and buffer semiconductor layers 128 are formed in the high-density device region, and a placeholder semiconductor layer 127-3 and buffer semiconductor layer 128' are formed in the high-performance device region.

Unlike what is shown in FIG. 5B in connection with semiconductor structure 100, in semiconductor structure 200 and in semiconductor structure 200', the remaining empty space in the opening 125-3 not occupied by the placeholder semiconductor layer 127-3 or buffer semiconductor layer 128' is not filled with placeholder dielectric fill layer 130. Instead, following epitaxial growth of source/drain region 135-4 in the high-performance device region, an air gap 132 is formed between the source/drain region 135-4 and the buffer semiconductor layer 128'. Also, different from the source/drain region 135-3, because epitaxial growth also occurs from exposed portions of the buffer semiconductor layer 128', which are not covered by the placeholder dielectric fill layer in the semiconductor structures 200/200', the source/drain region 135-4 includes an extension portion (E) between the air gap 132 and a remaining portion of the source/drain region 135-4.

Similar to FIGS. 7A-7C, FIGS. 15A and 15B depict RMG formation, MOL contact formation, BEOL interconnect formation and carrier wafer bonding in the high-density device region for semiconductor structures 200 and 200' and in the high-performance device region for semiconductor structure 200. FIG. 15C depicts an embodiment of the semiconductor structure 200' similar to the semiconductor structure 200, but without with a frontside MOL source/drain contact to the source/drain region 135-4 in the high-performance device region. Like what is shown in FIGS. 7A-7C, FIGS. 15A-15C illustrate gate structures 140/141, ILD layer 145, source/ drain contacts 150-1 and 150-2, frontside BEOL interconnects 155 and carrier wafer 157.

Figures 16A, 16B, 16C:
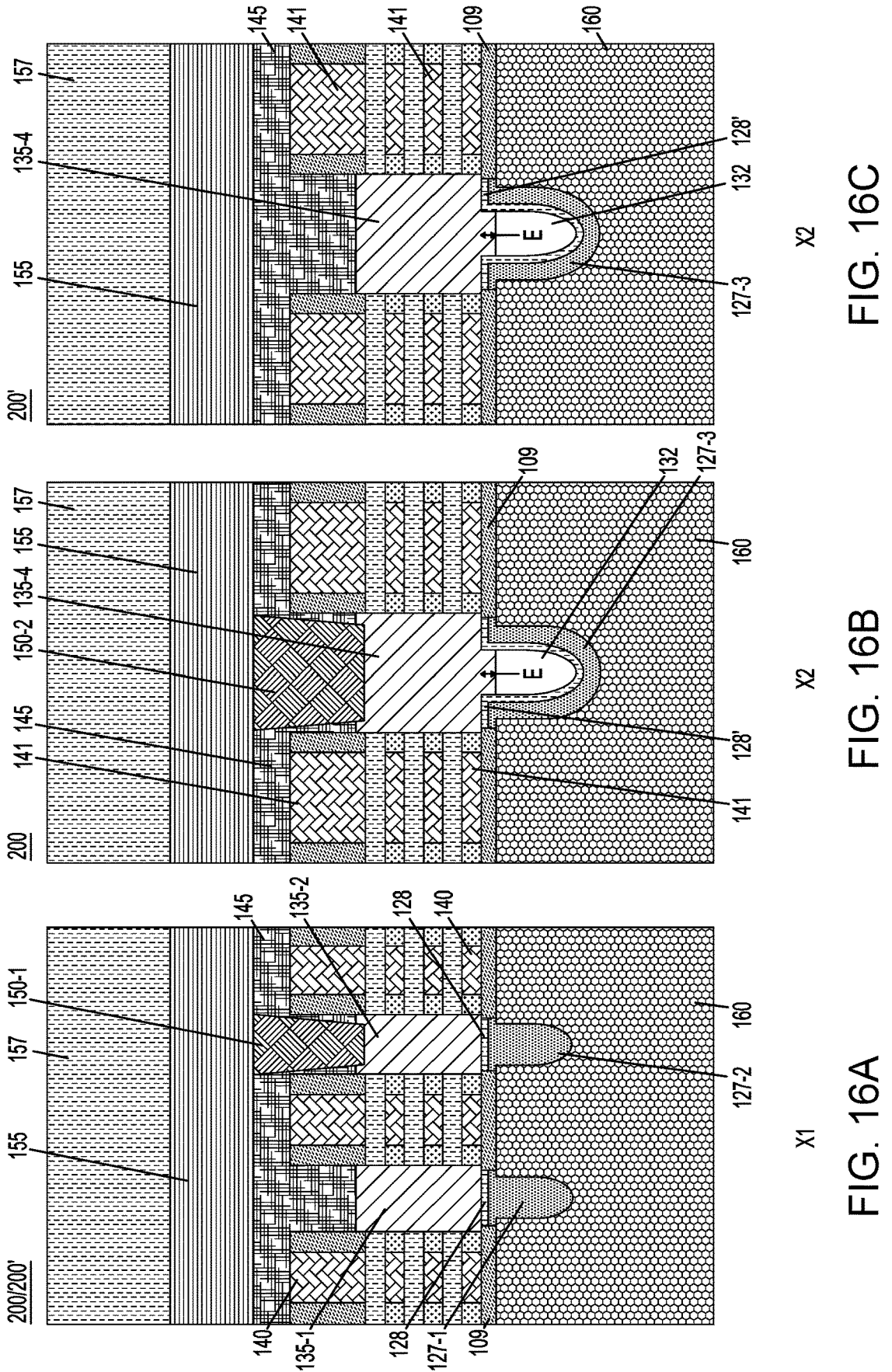
FIG. 16A depicts a first cross-sectional view corresponding to the line X1 in FIG. 1A following wafer flipping, semiconductor substrate removal and etch stop layer removal from the FIG. 15A structure and backside ILD layer formation and planarization in the high-density device region, according to an embodiment of the invention.
FIG. 16B depicts a second cross-sectional view corresponding to the line X2 in FIG. 1B following wafer flipping, semiconductor substrate removal and etch stop layer removal from the FIG. 15B structure and backside ILD layer formation and planarization in the high-performance device region, according to an embodiment of the invention.
FIG. 16C depicts a third cross-sectional view corresponding to the line X2 in FIG. 1B following wafer flipping, semiconductor substrate removal and etch stop layer removal from the FIG. 15C structure and backside ILD layer formation and planarization in the high-performance device region, according to an embodiment of the invention.

Similar to what is shown in FIGS. 8A-10C, referring to FIGS. 16A-16C, using the carrier wafer 157, the semiconductor structures 200/200' are "flipped" (e.g., rotated 180 degrees) so that the structures are inverted. In addition, the first semiconductor substrate 101, the etch stop layer 102 and the second semiconductor substrate 103 are removed from the backside of the semiconductor structures 200/200'. The etch stop layer 102 is removed, followed by removal of the second semiconductor substrate 103, wherein portions of the BDI layer 109, and the placeholder semiconductor layers 127-1, 127-2 and 127-3 are exposed. The backside ILD layer 160 is deposited to fill in areas formerly occupied by the second semiconductor substrate 103.

Figures 17A, 17B, 17C:
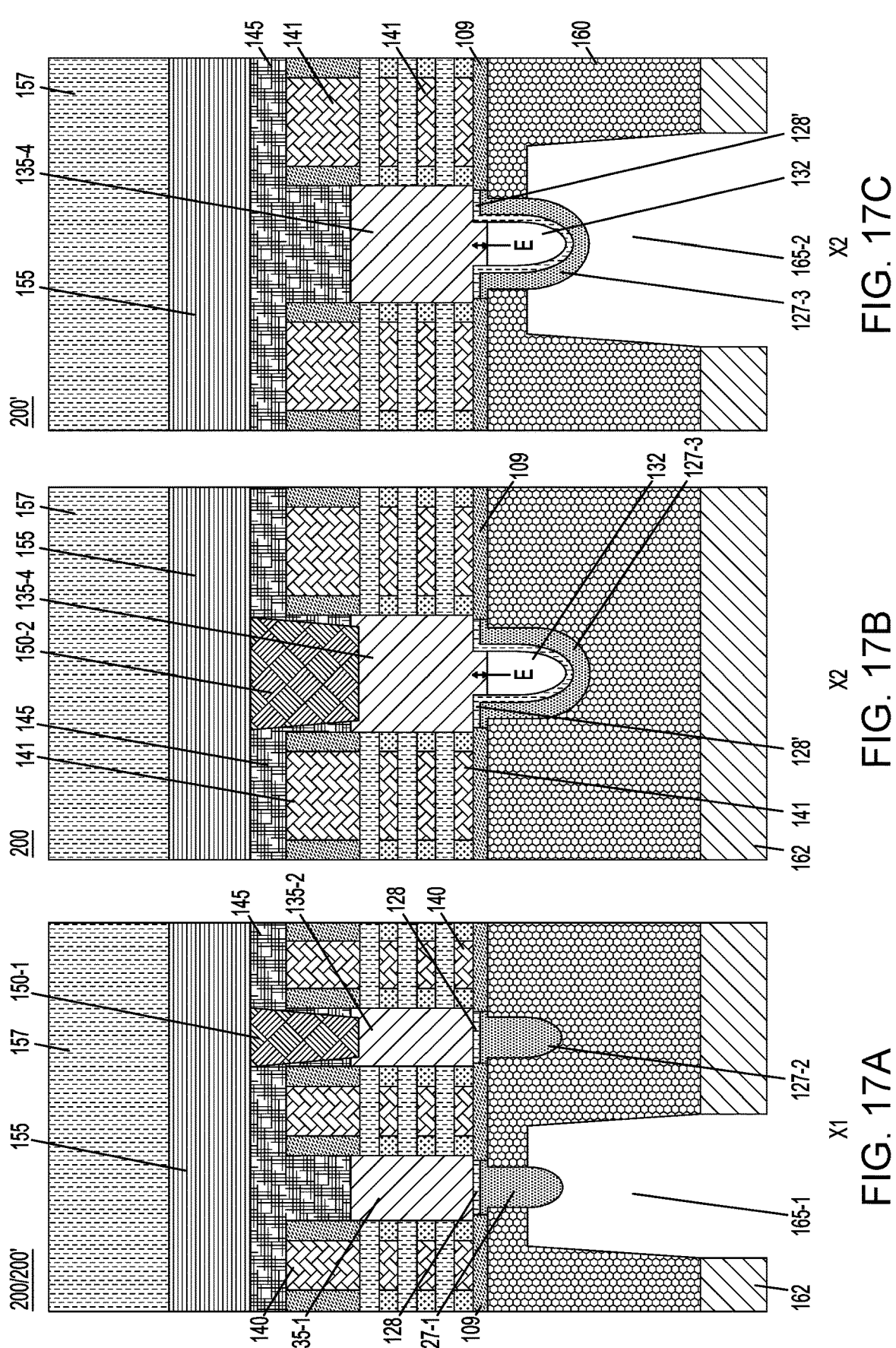
FIG. 17A depicts a first cross-sectional view corresponding to the line X1 in FIG. 1A following OPL formation on and backside contact patterning of the FIG. 16A structure in the high-density device region, according to an embodiment of the invention.
FIG. 17B depicts a second cross-sectional view corresponding to the line X2 in FIG. 1B following OPL formation on the FIG. 16B structure with no backside contact patterning in the high-density device region in the high-performance device region, according to an embodiment of the invention.
FIG. 17C depicts a third cross-sectional view corresponding to the line X2 in FIG. 1B following OPL formation on and backside contact patterning of the FIG. 16C structure in the high-density device region in the high-performance device region, according to an embodiment of the invention.

Similar to what is shown in FIGS. 11A-11C, referring to FIGS. 17A-17C, an OPL 162 is formed on portions of the backside ILD layer 160. An etching process such as, for example, RIE, is performed via the openings in the OPL 162 to form openings 165-1 and 165-2 (e.g., trenches) in the backside ILD layer 160 where the backside source/drain contacts 170-1 and 170-2 will be formed. The openings 165-1 and 165-2 are formed by etching through part of backside ILD layer 160. The openings 165-1 and 165-2 expose the placeholder semiconductor layer 127-1 in the high-density device region in the embodiments corresponding to semiconductor structure 200 and 200', and placeholder semiconductor layer 127-3 in the high-performance device region in the embodiment corresponding semiconductor structure 200'. The portion of the backside ILD layer 160 corresponding to the placeholder semiconductor layer 127-3 in the high-performance device region in the embodiment corresponding semiconductor structure 200 is not removed since the source/drain region 135-3 in the embodiment corresponding to semiconductor structure 200 is already contacted by frontside source/drain contact 150-2. Similarly, the portion of the backside ILD layer 160 corresponding to the placeholder semiconductor layer 127-2 in the high-density device region is not removed since the source/drain region 135-2 is already contacted by frontside source/drain contact 150-1.

Figures 18A, 18B, 18C:
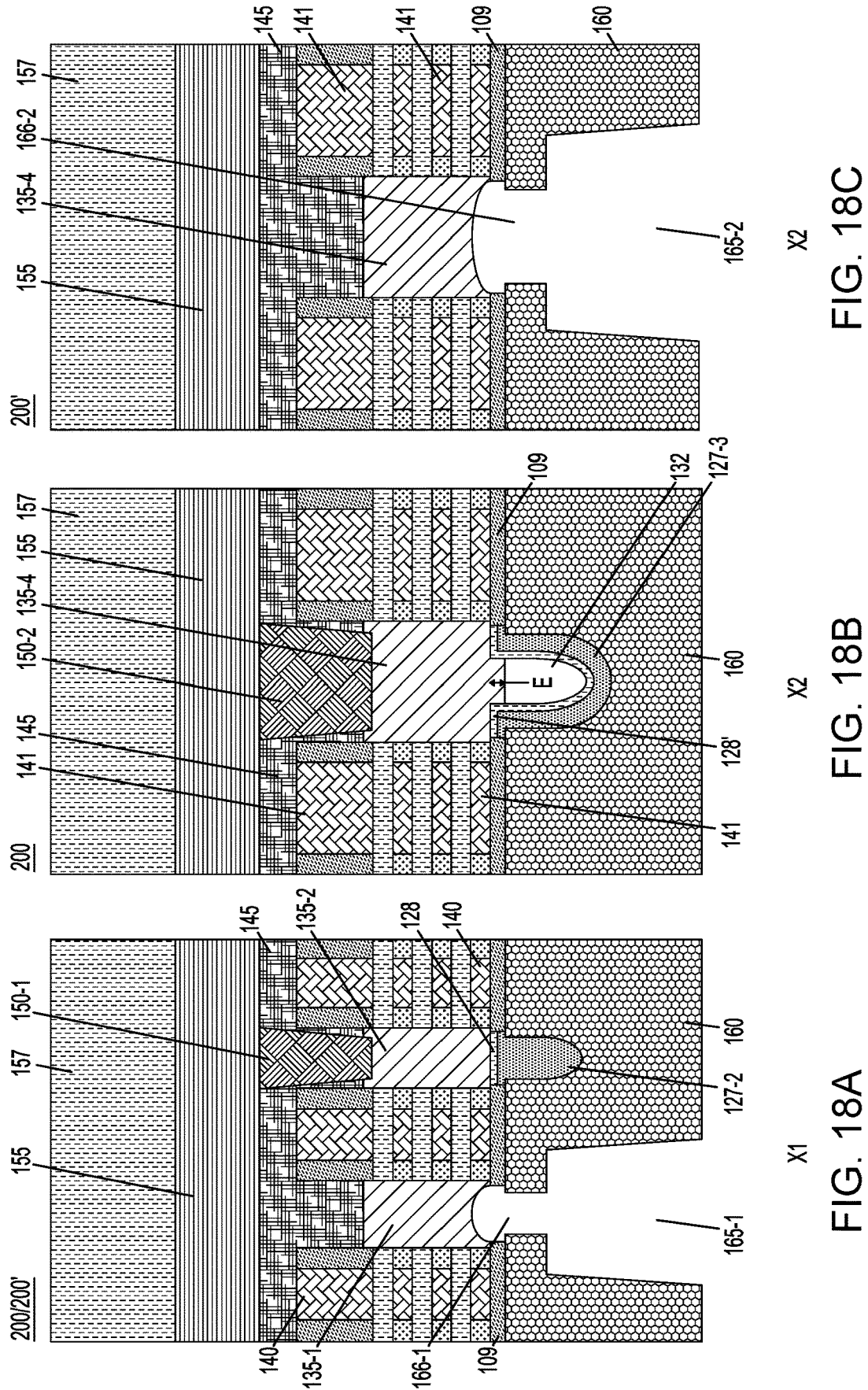
FIG. 18A depicts a first cross-sectional view corresponding to the line X1 in FIG. 1A following OPL and placeholder layer removal from the FIG. 17A structure and gouging of a source/drain region in the high-density device region, according to an embodiment of the invention.
FIG. 18B depicts a second cross-sectional view corresponding to the line X2 in FIG. 1B following OPL layer removal from the FIG. 17B structure in the high-density device region in the high-performance device region, according to an embodiment of the invention.
FIG. 18C depicts a third cross-sectional view corresponding to the line X2 in FIG. 1B following OPL and placeholder layer removal from the FIG. 17C structure and gouging of a source/drain region in the high-performance device region, according to an embodiment of the invention.

Similar to what is shown in FIGS. 12A-12C, referring to FIGS. 18A-18C, the OPL 162 is removed. The placeholder semiconductor layer 127-1 and corresponding buffer semiconductor layer 128 in the high-density device region and the placeholder semiconductor layer 127-3 and corresponding buffer semiconductor layer 128' in the high-performance device region in the embodiment corresponding semiconductor structure 200' are selectively removed to expose backside portions of the source/drain regions 135-1 and 135-3 and create openings 166-1 and 166-2.

Figures 19A, 19B, 19C:
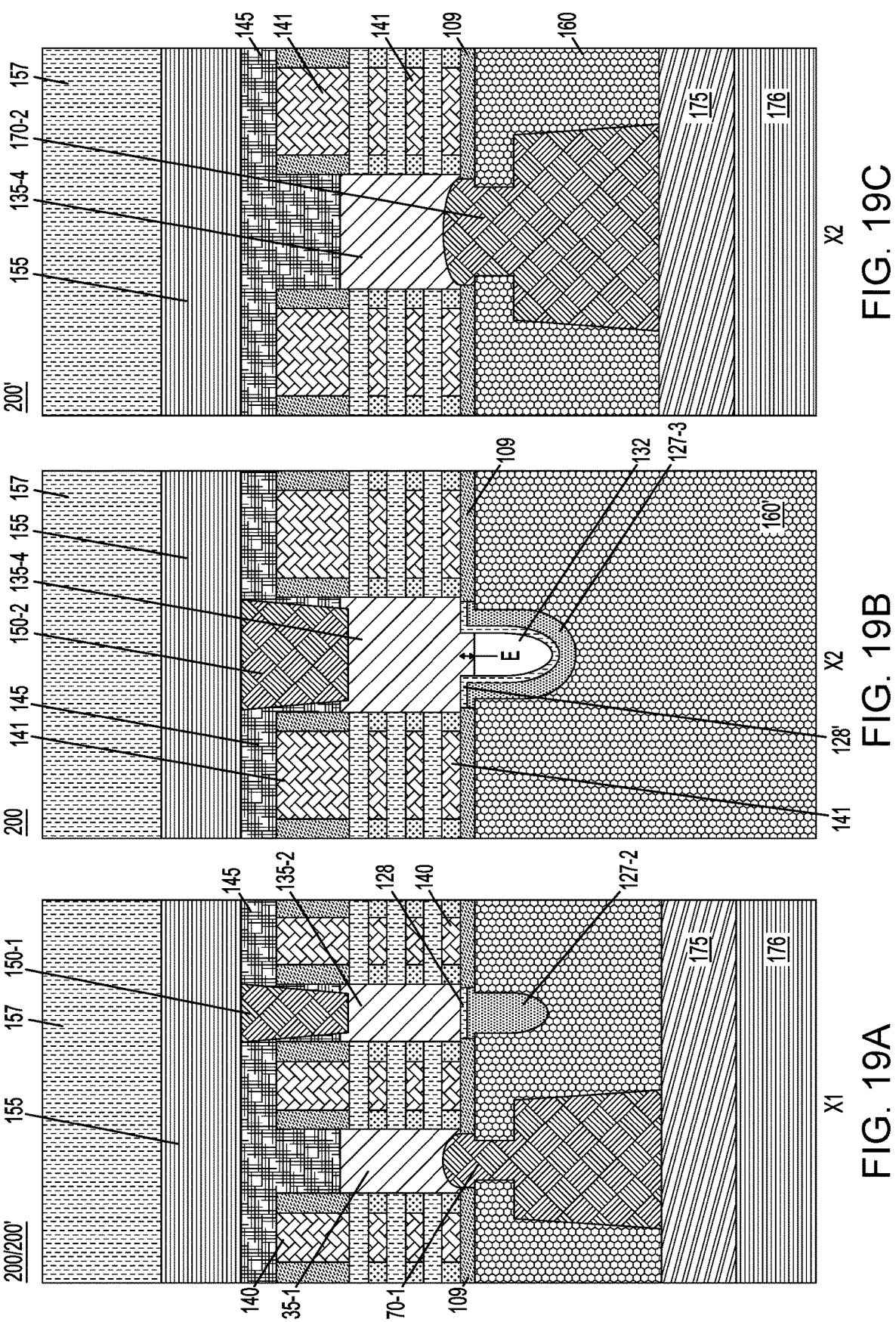
FIG. 19A depicts a first cross-sectional view corresponding to the line X1 in FIG. 1A following backside source/drain contact formation, BPR formation and BSPDN formation in the FIG. 18A structure in the high-density device region, according to an embodiment of the invention.
FIG. 19B depicts a second cross-sectional view corresponding to the line X2 in FIG. 1B following additional backside ILD layer formation on the FIG. 18B structure in the high-performance device region, according to an embodiment of the invention.
FIG. 19C depicts a third cross-sectional view corresponding to the line X2 in FIG. 1B following backside source/drain contact formation, BPR formation and BSPDN formation in the FIG. 18C structure in the high-performance device region, according to an embodiment of the invention.

Similar to what is shown in FIGS. 13A and 13C, referring to FIGS. 19A and 19C, the backside source/drain contacts 170-1 and 170-2 are formed in the backside ILD layer 160 in the openings 165-1, 166-1, 165-2 and 166-2. Referring to FIG. 19B, which depicts the high-performance device region of the semiconductor structure 200, additional backside ILD material is deposited to form an additional backside ILD layer 160' on the backside ILD layer 160. As shown in FIGS. 19A and 19C, a backside power rail 175 (e.g., conductive wires) is formed in portions of the additional backside ILD layer 160'. BSPDN layers 176 are formed on the backside power rail 175 in the semiconductor structures 200 and 200'.

In the semiconductor structures 100/100'/200/200', in a high-density device region, a first nanosheet transistor is disposed on a dielectric layer (e.g., backside ILD layer 160), and comprises a source/drain region (e.g., source/drain region 135-1 or 135-2) disposed on a side of the first nanosheet transistor. In a high-performance device region, a second nanosheet transistor is disposed on the dielectric layer, and comprises a second source/drain region (e.g., 135-3 or 135-4) disposed on a side of the second nanosheet transistor. The second source/drain region has a larger dimension along a given direction (e.g., parallel to an upper surface of the backside ILD layer 160 (left to right direction in cross-sectional views)) than a dimension of the first source/drain region along the given direction. For example, the upper surface of the backside ILD layer 160 interfaces with a bottom surface of the BDI layer 109. Different from the high-density device region, the high-performance device region advantageously includes wider (left to right direction in cross-sectional views) nanosheet transistors (e.g., wider channel layers 107/107', wider gate structures 141, wider source/drain regions 135-3/135-4) than the nanosheet transistors in the high-density device region.

In the semiconductor structure 100, a dielectric fill layer (e.g., placeholder dielectric fill layer 130) is disposed in the dielectric layer under the second source/drain region and a semiconductor layer (e.g., placeholder semiconductor layer 127-3) is disposed under the second source/drain region, in the dielectric layer and around the dielectric fill layer. In the semiconductor structure 200, an air gap (e.g., air gap 132) is disposed in the dielectric layer under the second source/drain region and a semiconductor layer (e.g., placeholder semiconductor layer 127-3) is disposed under the second source/drain region, in the dielectric layer and around the air gap. The placeholder semiconductor layer 127-3 has a U-shape, and a portion thereof is disposed on the dielectric layer. An additional semiconductor layer (e.g., buffer semiconductor layer 128') is disposed around the dielectric fill layer in the semiconductor structure 100 and around the air gap in the semiconductor structure 200. The additional semiconductor layer (e.g., buffer semiconductor layer 128') may be disposed between the semiconductor layer (e.g., placeholder semiconductor layer 127-3) and the dielectric fill layer or the air gap. In some embodiments, the source/drain region (e.g., source/drain region 135-4) comprises an extension portion between the air gap and a remaining portion of the source/drain region.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

As noted above, the embodiments provide techniques and structures to form placeholder structures in high-density and high-performance device regions. In high-performance device regions, where the channels and space between nanosheet structures (and consequently source/drain regions) are wider, epitaxially grown contact placeholders may not merge, and leave open spaces. The embodiments provide a technical solution to add a dielectric fill layer or utilize an air gap as part of the placeholder structure to compensate for the inability to merge during epitaxial placeholder growth.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
at least one first nanosheet transistor disposed on a dielectric layer, the at least one first nanosheet transistor comprising at least one first source/drain region disposed on a side of the at least one first nanosheet transistor;
at least one second nanosheet transistor disposed on the dielectric layer, the at least one second nanosheet transistor comprising at least one second source/drain region disposed on a side of the at least one second nanosheet transistor, wherein the at least one second source/drain region has a larger dimension along a given direction than a dimension of the at least one first source/drain region along the given direction;
one of a dielectric fill layer and an air gap disposed in the dielectric layer and under the at least one second source/drain region; and
a semiconductor layer disposed under the at least one second source/drain region, in the dielectric layer and around the one of the dielectric fill layer and the air gap.

2. The semiconductor structure of claim 1, wherein:
the at least one first nanosheet transistor comprises a first plurality of gate structures alternately stacked with a first plurality of channel layers;
the at least one second nanosheet transistor comprises a second plurality of gate structures alternately stacked with a second plurality of channel layers; and
the second plurality of channel layers have a larger dimension along the given direction than a dimension of the first plurality of channel layers along the given direction.

3. The semiconductor structure of claim 1, wherein the given direction is parallel to an upper surface of the dielectric layer.

4. The semiconductor structure of claim 1, wherein the semiconductor layer has a U-shape.

5. The semiconductor structure of claim 1, wherein a portion of the semiconductor layer is disposed on the dielectric layer.

6. The semiconductor structure of claim 1, further comprising an additional semiconductor layer disposed around the one of the dielectric fill layer and the air gap and between the semiconductor layer and the one of the dielectric fill layer and the air gap.

7. The semiconductor structure of claim 1, wherein the semiconductor layer is disposed around the air gap, and the at least one second source/drain region comprises an extension portion between the air gap and a remaining portion of the at least one second source/drain region.

8. The semiconductor structure of claim 1, further comprising a source/drain contact disposed on the at least one second source/drain region on a first side of the semiconductor structure opposite a second side of the semiconductor structure, wherein the one of the dielectric fill layer and the air gap is disposed on the second side of the semiconductor structure.

9. The semiconductor structure of claim 8, further comprising an additional source/drain contact disposed on the at least one first source/drain region on the second side of the semiconductor structure.

10. The semiconductor structure of claim 9, wherein the first side comprises a frontside of the semiconductor structure and the second side comprises a backside of the semiconductor structure.

11. The semiconductor structure of claim 1, further comprising an additional semiconductor layer disposed in the dielectric layer and under the at least one first source/drain region.

12. A semiconductor structure comprising:

a first device disposed on a dielectric layer and comprising a first source/drain region and a first plurality of gate structures alternately stacked with a first plurality of channel layers;

a second device disposed on the dielectric layer and comprising a second source/drain region and a second plurality of gate structures alternately stacked with a second plurality of channel layers, wherein the second source/drain region and the second plurality of channel layers respectively have larger dimensions along a given direction than dimensions of the first source/drain region and the first plurality of channel layers along the given direction;

one of a dielectric fill layer and an air gap disposed in the dielectric layer and under the second source/drain region; and a semiconductor layer disposed under the second source/drain region and around the one of the dielectric fill layer and the air gap.

13. The semiconductor structure of claim 12, wherein the given direction is parallel to an upper surface of the dielectric layer.

14. The semiconductor structure of claim 12, wherein the semiconductor layer has a U-shape.

15. The semiconductor structure of claim 12, further comprising an additional semiconductor layer disposed around the one of the dielectric fill layer and the air gap and between the semiconductor layer and the one of the dielectric fill layer and the air gap.

16. The semiconductor structure of claim 12, wherein the semiconductor layer is disposed around the air gap, and the second source/drain region comprises an extension portion between the air gap and a remaining portion of the second source/drain region.

17. A semiconductor structure comprising:

at least one nanosheet transistor disposed on a dielectric layer, the at least one nanosheet transistor comprising at least one source/drain region disposed on a side of the at least one nanosheet transistor;

one of a dielectric fill layer and an air gap disposed in the dielectric layer and under the at least one source/drain region;

a semiconductor layer disposed under the at least one source/drain region, in the dielectric layer and around the one of the dielectric fill layer and the air gap; and an additional semiconductor layer disposed around the one of the dielectric fill layer and the air gap and between the semiconductor layer and the one of the dielectric fill layer and the air gap.

18. The semiconductor structure of claim 17, wherein the semiconductor layer has a U-shape.

19. The semiconductor structure of claim 17, wherein the semiconductor layer is disposed around the air gap, and the at least one source/drain region comprises an extension portion between the air gap and a remaining portion of the at least one source/drain region.

*    *    *    *    *